(12) United States Patent
Atsmon

(10) Patent No.: US 10,489,972 B2
(45) Date of Patent: Nov. 26, 2019

(54) REALISTIC 3D VIRTUAL WORLD CREATION AND SIMULATION FOR TRAINING AUTOMATED DRIVING SYSTEMS

(71) Applicant: Cognata Ltd., Rehovot (IL)

(72) Inventor: Dan Atsmon, Rehovot (IL)

(73) Assignee: Cognata Ltd., Rehovot (IL)

( * ) Notice: Subject to any disclaimer, the term of this patent is extended or adjusted under 35 U.S.C. 154(b) by 0 days.

(21) Appl. No.: 16/313,058

(22) PCT Filed: May 29, 2017

(86) PCT No.: PCT/IL2017/050598
§ 371 (c)(1),
(2) Date: Dec. 24, 2018

(87) PCT Pub. No.: WO2018/002910
PCT Pub. Date: Jan. 4, 2018

(65) Prior Publication Data
US 2019/0228571 A1 Jul. 25, 2019

Related U.S. Application Data

(60) Provisional application No. 62/384,733, filed on Sep. 8, 2016, provisional application No. 62/355,368, filed on Jun. 28, 2016.

(51) Int. Cl.
*G06T 7/00* (2017.01)
*G06T 17/00* (2006.01)
(Continued)

(52) U.S. Cl.
CPC .......... *G06T 17/05* (2013.01); *G05D 1/0088* (2013.01); *G05D 1/0221* (2013.01); *G06F 17/5009* (2013.01); *G05D 2201/0213* (2013.01)

(58) Field of Classification Search
CPC .................................................. G06K 9/00791
See application file for complete search history.

(56) References Cited

U.S. PATENT DOCUMENTS

2007/0088469 A1 4/2007 Schmiedel et al.
2008/0033684 A1 2/2008 Vian et al.
(Continued)

FOREIGN PATENT DOCUMENTS

WO WO 2018/002910 1/2018

OTHER PUBLICATIONS

Hattori et al., "Learning Scene-Specific Pedestrian Detectors without Real Data", 2015, The IEEE Conference on Computer Vision and Pattern Recognition (CVPR), pp. 3819-3827 (Year: 2016).*
(Continued)

*Primary Examiner* — Phong X Nguyen

(57) ABSTRACT

A computer implemented method of creating a simulated realistic virtual model of a geographical area for training an autonomous driving system, comprising obtaining geographic map data of a geographical area, obtaining visual imagery data of the geographical area, classifying static objects identified in the visual imagery data to corresponding labels to designate labeled objects, superimposing the labeled objects over the geographic map data, generating a virtual 3D realistic model emulating the geographical area by synthesizing a corresponding visual texture for each of the labeled objects and injecting synthetic 3D imaging feed of the realistic model to imaging sensor(s) input(s) of the autonomous driving system controlling movement of an emulated vehicle in the realistic model where the synthetic 3D imaging feed is generated to depict the realistic model from a point of view of emulated imaging sensor(s) mounted on the emulated vehicle.

18 Claims, 5 Drawing Sheets

(51) Int. Cl.
*G06T 17/05* (2011.01)
*G05D 1/02* (2006.01)
*G06F 17/50* (2006.01)
*G05D 1/00* (2006.01)

(56) References Cited

U.S. PATENT DOCUMENTS

| | | | |
|---|---|---|---|
| 2014/0125767 A1* | 5/2014 | Bell | G06T 19/20 348/46 |
| 2014/0267723 A1* | 9/2014 | Davidson, Jr. | H04N 7/183 348/147 |
| 2014/0309836 A1 | 10/2014 | Ollis | |
| 2014/0316611 A1* | 10/2014 | Parente Da Silva | G06T 19/006 701/2 |
| 2014/0320485 A1* | 10/2014 | Neophytou | G06K 9/00214 345/419 |
| 2016/0137206 A1 | 5/2016 | Chandraker et al. | |
| 2016/0314224 A1* | 10/2016 | Wei | G06F 17/5009 |
| 2017/0154425 A1* | 6/2017 | Pierce | G06K 9/4671 |
| 2017/0177954 A1* | 6/2017 | Micks | G06K 9/209 |
| 2017/0213149 A1* | 7/2017 | Micks | B60W 30/09 |
| 2017/0243083 A1* | 8/2017 | Wang | G06K 9/00711 |
| 2017/0270361 A1* | 9/2017 | Puttagunta | G06K 9/00664 |
| 2018/0349526 A1 | 12/2018 | Atsmon et al. | |
| 2019/0026956 A1* | 1/2019 | Gausebeck | G06T 19/20 |

OTHER PUBLICATIONS

Woods et al., "GLIDAR: An OpenGL-based, Real-Time, and Open Source 3D Sensor Simulator for Testing Computer Vision Algorithms", 2016, Journal of Imaging, 2, 5, pp. 1-9 (Year: 2016).*
Ros et al., "The SYNTHIA Dataset: A Large Collection of Synthetic Images for Semantic Segmentation of Urban Scenes", 2016, The IEEE Conference on Computer Vision and Pattern Recognition (CVPR), pp. 3234-3243 (Year: 2016).*
International Preliminary Report on Patentability dated Jan. 10, 2019 From the International Bureau of WIPO Re. Application No. PCT/IL17/050598. (9 Pages).
European Search Report and the European Search Opinion dated Nov. 6, 2018 From the European Patent Office Re. Application No. 18174957.3. (11 Pages).
Invitation to Pay Additional Fees dated Sep. 5, 2017 From the International Examining Authority Re. Application No. PCT/IL2017/050598.
International Search Report and the Written Opinion dated Nov. 17, 2017 From the International Searching Authority Re. Application No. PCT/IL17/050598. (17 Pages).
Jayaraman et al. "Creating 3D Virtual Driving Environments for Simulation-Aided Development of Autonomous Driving and Active Safety", SAE Technical Paper Series, SAE International, XP055518353, 2017-01-0107: 1-6, Mar. 28, 2017. Abstract, Section 'Virtual Camera Setup', Section 'Modeling Virtual LiDAR Distance Measurements'.
Sukthankar et al. "SHIVA: Simulated Highways for Intelligent Vehicle Algorithms", Proceedings of the Intelligent Vehicles '95 Symposium, XP010194139, Detroit, MI, USA, Sep. 25-26, 1995, p. 332-337, Sep. 25, 1995. p. 334, l-h Col.

* cited by examiner

REALISTIC 3D VIRTUAL WORLD CREATION AND SIMULATION FOR TRAINING AUTOMATED DRIVING SYSTEMS

RELATED APPLICATIONS

This application is a National Phase of PCT Patent Application No. PCT/IL2017/050598 having International filing date of May 29, 2017, which claims the benefit of priority under 35 USC § 119(e) of U.S. Provisional Patent Application Nos. 62/355,368 filed on Jun. 28, 2016 and 62/384,733 filed on Sep. 8, 2016. The contents of the above applications are all incorporated by reference as if fully set forth herein in their entirety.

BACKGROUND

The present invention, in some embodiments thereof, relates to creating a simulated model of a geographical area, and, more specifically, but not exclusively, to creating a simulated model of a geographical area, optionally including transportation traffic to generate simulation sensory data for training an autonomous driving system.

The arena of autonomous vehicles, either ground vehicles, aerial vehicles and/or naval vehicles has witnessed an enormous evolution during recent times. Major resources are invested in the autonomous vehicles technologies and the field is therefore quickly moving forward towards the goal of deploying autonomous vehicles for a plurality of applications, for example, transportation, industrial, military uses and/or the like.

The autonomous vehicles involve a plurality of disciplines targeting a plurality of challenges rising in the development of the autonomous vehicles. However in addition to the design and development of the autonomous vehicles the need for multiple and diversified support eco-systems for training, evaluating and/or validating the autonomous driving systems controlling the autonomous cars.

SUMMARY

According to a first aspect of the present invention there is provided a computer implemented method of creating a simulated realistic virtual model of a geographical area for training an autonomous driving system, comprising:
  Obtaining geographic map data of a geographical area.
  Obtaining visual imagery data of the geographical area.
  Classifying a plurality of static objects identified in the visual imagery data to corresponding labels to designate a plurality of labeled objects.
  Superimposing the plurality of labeled objects over the geographic map data.
  Generating a virtual three dimensional (3D) realistic model emulating the geographical area by synthesizing a corresponding visual texture for each of the plurality of labeled objects.
  Injecting synthetic 3D imaging feed of the realistic model to an input of one or more imaging sensors of the autonomous driving system controlling movement of an emulated vehicle in the realistic model. The synthetic 3D imaging feed is generated to depict the realistic model from a point of view of one or more emulated imaging sensors mounted on the emulated vehicle.

Training the autonomous driving systems using the simulated virtual realistic model may allow for significant scalability since a plurality of various ride scenarios may be easily simulated for a plurality of geographical locations. Training, evaluation and/or validation of the autonomous driving systems may be done automatically by an automated system executing the simulated virtual realistic model. Moreover, the training, evaluation and/or validation may be done for a plurality of geographical area, various conditions and/or various scenarios without moving real vehicles in the real world. In addition, the automated training, evaluation and/or validation may be conducted concurrently for the plurality of geographical area, the various conditions and/or the various scenarios. This may significantly reduce the resources, for example, time, hardware resources, human resources and/or the like for training, evaluating and/or validating the autonomous driving systems. Moreover, training the autonomous driving systems using the simulated virtual realistic model may significantly reduce risk since the process is conducted in a virtual environment. Damages, accidents and even life loss which may occur using the currently existing methods for training the autonomous driving systems may be completely prevented and avoided.

According to a second aspect of the present invention there is provided a system for creating a simulated virtual realistic model of a geographical area for training an autonomous driving system, comprising one or more processors adapted to execute code, the code comprising:
  Code instructions to obtain geographic map data of a geographical area.
  Code instructions to obtain visual imagery data of the geographical area.
  Code instructions to classify a plurality of static objects identified in the visual imagery data to corresponding labels to designate a plurality of labeled objects.
  Code instructions to superimpose the plurality of labeled objects over the geographic map data.
  Code instructions to generate a virtual three dimensional (3D) realistic model emulating the geographical area by synthesizing a corresponding visual texture for each of the plurality of labeled objects.
  Code instructions to inject synthetic 3D imaging feed of the realistic model to an input of one or more imaging sensors of the autonomous driving system controlling movement of an emulated vehicle in the realistic model. The synthetic 3D imaging feed is generated to depict the realistic model from a point of view of one or more emulated imaging sensors mounted on the emulated vehicle.

In a further implementation form of the first and/or second aspects, the synthesizing is done using one or more of the following implementations:
  Applying one or more conditional generative adversarial neural network (cGAN) to transform a label of one or more of the plurality of labeled objects to a respective visual texture.
  Extracting the visual texture of one or more of the labeled objects from the visual imagery data.
  Retrieving the visual texture of one or more of the labeled objects from a repository comprising a plurality of texture images of a plurality of static objects.

Using one or more of the synthesis implementations may allow selecting the most appropriate technique for each of the labeled objects detected in the geographical area to create a genuine and highly realistic appearance of the object(s).

In a further implementation form of the first and/or second aspects, the synthetic 3D imaging feed is injected to a physical input of the autonomous driving system adapted to receive the input of the one or more imaging sensors. Using the native physical interfaces of the autonomous driving system may significantly reduce and/or completely avoid the need to adjust the autonomous driving system to support the simulated virtual realistic model.

In a further implementation form of the first and/or second aspects, the autonomous driving system is implemented as a computer software program. The synthetic 3D imaging data is injected using one or more virtual drivers emulating a feed of the one or more imaging sensors. Using the native software interfaces of the autonomous driving system may significantly reduce and/or completely avoid the need to adjust the autonomous driving system to support the simulated virtual realistic model.

In an optional implementation form of the first and/or second aspects, one or more mounting attributes of the one or more imaging sensors are adjusted according to analysis of a visibility performance of the one or more emulated imaging sensors emulating the one or more imaging sensors. The mounting attributes may include, for example, a positioning on the emulated vehicle, a Field Of View (FOV), a resolution and an overlap region with one or more adjacent imaging sensors. The emulated imaging sensor(s) may be mounted on the emulated vehicle similarly to the mounting of the real imagining sensor(s) on the real vehicle. Therefore exploring, evaluating and/or assessing the performance of the emulated imaging sensors which may be easily accomplished in the simulated virtual model may directly apply for the real imaging sensor(s). Mounting recommendation(s) including imaging sensor(s) characteristics, model(s) and/or capabilities may therefore be offered to improve performance of the real imaging sensor(s).

In an optional implementation form of the first and/or second aspects, a sensory ranging data feed simulation which simulates sensory ranging data feed generated by one or more emulated range sensors mounted on the emulated vehicle. The sensory ranging data feed is simulated using a simulated ranging model applying one or more noise patterns associated with one or more range sensors emulated by the one or more emulated range sensors. This may further enhance the virtual realistic model to encompass the sensory ranging data feed which may be an essential feed for the autonomous driving system to identify the vehicle's surroundings and control the autonomous vehicle accordingly.

In an optional implementation form of the first and/or second aspects, the one or more noise patterns are adjusted according to one or more object attributes of one or more of a plurality of objects emulated in the realistic model. The noise patterns may be applied to the ranging model created for the virtual realistic model in order to increase the realistic characteristics of the model. Generating the simulated sensory ranging data may be based on highly accurate ranging information extracted, for example, from the geographic map data, the visual imagery data and/or other data sources. However, real world sensory ranging data may be far less accurate. In order to feed the autonomous driving system with a realistic sensory ranging data feed, typical noise patterns learned over time for the real world may be applied to the simulated sensory ranging data.

In an optional implementation form of the first and/or second aspects, one or more mounting attributes of the one or more range sensors are adjusted according to analysis of a range accuracy performance of the one or more range sensors. The mounting attributes may include, for example, a positioning on the emulated vehicle, an FOV, a range and an overlap region with one or more adjacent range sensors. The emulated range sensor(s) may be mounted on the emulated vehicle similarly to the mounting of the real range sensor(s) on the real vehicle. Therefore exploring, evaluating and/or assessing the performance of the emulated range sensors which may be easily accomplished in the simulated virtual model may directly apply for the real range sensor(s). Mounting recommendation(s) including range sensor(s) characteristics, model(s) and/or capabilities may therefore be offered to improve performance of the real range sensor(s).

In an optional implementation form of the first and/or second aspects, one or more dynamic objects are inserted into the realistic model. The dynamic object(s) may include, for example, a ground vehicle, an aerial vehicle, a naval vehicle, a pedestrian, an animal, vegetation and a dynamically changing road infrastructure object. This may allow creating a plurality of driving scenarios for training, evaluating and/or validating the autonomous driving system. The driving scenarios may emulate real world traffic, road infrastructure objects, pedestrians, animals, vegetation, and/or the like.

In an optional implementation form of the first and/or second aspects, one or more of a plurality of driver behavior classes are applied for controlling a movement of one or more ground vehicles such as the ground vehicle. The driver behavior classes are adapted to the geographical area according to an analysis of typical driver behavior patterns identified in the geographical area, the one or more driver behavior class is selected according to a density function calculated for the geographical area according to recurrence of drivers prototype corresponding to the one or more driver behavior classes in the geographical area. Adapting the movement of the simulated vehicles to driving classes and patterns as typical to the geographical area may significantly enhance the realistic and/or authentic simulation of the geographical area.

In an optional implementation form of the first and/or second aspects, simulated motion data is injected to the autonomous driving system. The simulated motion data is emulated by one or more emulated motion sensors associated with the emulated vehicle. The simulated motion data comprising one or more motion parameters, for example, a speed parameter, an acceleration parameter, a direction parameter, an orientation parameter and an elevation parameter. This may further enhance the virtual realistic model to emulate the real world geographical area by including the sensory motion data feed which may serve as a major feed for the autonomous driving system.

In an optional implementation form of the first and/or second aspects, simulated transport data is injected to the autonomous driving system. The simulated transport data comprises Vehicle to Anything (V2X) communication between the emulated vehicle and one or more other entities. This may further enhance the virtual realistic model to emulate the real world geographical area by including the transport data feed which may serve as a major feed for the autonomous driving system.

In an optional implementation form of the first and/or second aspects, the synthetic imaging data is adjusted according to one or more environmental characteristics, for example, a lighting condition, a weather condition attribute and timing attribute. This may further increase ability for adjusting the virtual realistic model to simulate diverse environmental conditions to train, evaluate and/or validate the operation of the autonomous driving system in a plurality of scenarios and conditions.

In a further implementation form of the first and/or second aspects, the geographic map data includes, for example, a two dimensional (2D) map, a 3D map, an orthophoto map, an elevation map and a detailed map comprising object description for objects present in the geographical area. Using a plurality of diverse map data sources may support creating an accurate and/or highly detailed virtual model of the emulated geographical area.

In a further implementation form of the first and/or second aspects, the visual imagery data comprises one or more images which are members of a group consisting of: a ground level image, an aerial image and a satellite image, wherein the one or more images are 2D images or 3D images. Using multiple diverse visual imagery data items may support creating an accurate and/or highly detailed virtual model of the emulated geographical area.

In a further implementation form of the first and/or second aspects, each of the plurality of static objects is a member of a group consisting of: a road, a road infrastructure object, an intersection, a building, a monument, a structure, a natural object and a terrain surface. This may allow focusing on the traffic, transportation and/or road infrastructure elements which may be of particular interest for training, evaluating and/or validating the autonomous driving system.

In a further implementation form of the first and/or second aspects, the one or more imaging sensors are members of a group consisting of: a camera, a video camera, an infrared camera and a night vision sensor. The virtual realistic model may support emulation of a plurality of different imaging sensors to allow training, evaluating and/or validating of a plurality of autonomous driving systems which may be adapted to receive diverse and/or different sensory imaging data feeds.

According to a third aspect of the present invention there is provided a computer implemented method of creating a simulated ranging model of a real world scene used for training an autonomous driving system, comprising:
  Obtaining real ranging data to a plurality of objects present in a real world scene.
  Obtaining sensory ranging data from a plurality of range sensors depicting the real world scene. Each of the plurality of range sensors is associated with positioning data indicating a positioning of the each range sensor, the positioning data is obtained from one or more positioning sensors associated with the each range sensor.
  Analyzing the ranging sensory data, adjusted according to the positioning data, with respect to the real ranging data to identify one or more noise patterns affecting measurement accuracy degradation exhibited by one or more of the plurality of range sensors.
  Updating a ranging model with the one or more noise patterns to generate realistic simulation ranging data for training an autonomous driving system.

Using large amounts of real world sensory ranging data collected at a plurality of geographical areas, scenes and/or locations may allow generating significantly accurate noise patterns associated with the range sensors and/or the objects present in the scene. The noise patterns may then be used to enhance a virtual realistic model replicating a real world geographical area with a realistic sensory ranging feed injected to the autonomous driving system during a training, evaluation and/or validation session.

In a further implementation form of the third aspect, the real ranging data is provided from one or more sources, for example, a real world measurement, a map based calculation and a calculation based on image processing of one or more images of the real world scene. This may allow obtain accurate ranging information for the plurality of objects present on the scene.

In a further implementation form of the third aspect, the plurality of range sensors include, for example, a LIDAR sensor, a radar, a camera, an infrared camera and an ultrasonic sensor. The virtual realistic model may support emulation of a plurality of different range sensors to allow training, evaluating and/or validating of a plurality of autonomous driving systems which may be adapted to receive diverse sensory ranging data.

In a further implementation form of the third aspect, the one or more positioning sensors include, for example, a Global Positioning system (GPS) sensor, a gyroscope, an accelerometer, an Inertial Measurement Unit (IMU) sensor and an elevation sensor. Positioning information is essential for establishing a reference for the real sensory ranging data collected from the range sensors. Supporting multiple diverse types of motion sensors may allow improved (more accurate) processing and analysis of the collected sensory ranging data.

In an optional implementation form of the third aspect, the positioning data includes motion data comprising one or more motion parameters of the associated range sensor, for example, a speed parameter, an acceleration parameter, a direction parameter, an orientation parameter and an elevation parameter. Availability of the motion information may also significantly improve accuracy of the collected sensory ranging data. Motion of the vehicles may affect the readings of the range sensor(s) mounted on the associated vehicles and therefore processing and analyzing the sensory ranging data with respect to the motion data may improve accuracy of the collected ranging data which may eventually result in creating more accurate noise pattern(s).

In a further implementation form of the third aspect, the analysis is a statistics based prediction analysis conducted using one or more machine learning algorithms, for example, a neural network and a Support Vector Machine (SVM). Applying the machine learning algorithm(s) over large amounts of sensory data may significantly improve the characterization of the noise patterns associated with the range sensor(s) and/or the objects and/or type of objects detected in the real world scene.

In a further implementation form of the third aspect, the one or more noise patterns comprise one or more noise characteristics, for example, a noise value, a distortion value, a latency value and a calibration offset value. The noise pattern(s) may describe a plurality of noise characteristics originating from the range sensor(s) themselves and/or from characteristics of the objects in the scene. Identifying the noise characteristics, in particular using the machine learning algorithm(s) to detect the noise characteristics may significantly improve the accuracy of the noise patterns which may be further improve the virtual realistic model.

In an optional implementation form of the third aspect, the analysis of the sensory data is done according to one or more environmental characteristics detected during acquisition of the ranging sensory data. The environmental characteristics include, for example, a weather condition attribute, and a timing attribute. The environmental conditions may affect the sensory ranging data and therefore analyzing the collected sensory ranging data with respect to the environmental conditions of the scene while acquiring the sensory ranging data may further increase accuracy of the identified noise pattern(s).

In an optional implementation form of the third aspect, the one or more noise patterns are adjusted according to one or more object attributes of one or more of the plurality of objects, the one or more object attributes affect the ranging data produced by the each range sensor, the one or more object attributes are members of a group consisting of: an external surface texture, an external surface composition and an external surface material. The characteristics of the objects in the scene and in particular the exterior characteristics of the objects may affect the sensory ranging data and therefore analyzing the collected sensory ranging data with respect to the object(s) characteristic(s) may further increase accuracy of the identified noise pattern(s).

In a further implementation form of the third aspect, the one or more object attributes are extracted from synthetic 3D imaging data generated for the real world scene. Extracting the object(s) characteristic(s) from the synthetic 3D imaging data may be relatively easy as the object(s) in the scene are identified and may be correlated with their characteristic(s) according to predefined rules.

In a further implementation form of the third aspect, the one or more object attributes are retrieved from a metadata record associated with the real world scene. Attribute(s) of similar objects may vary between geographical areas and/or real world scenes. Therefore, retrieving the object(s) attribute(s) from predefined records may allow associating the object(s) with their typical attribute(s) as found in the respective scene to further improve characterizing the noise characteristics and noise patterns for specific geographical areas, locations and/or real world scenes.

According to a fourth aspect of the present invention there is provided a computer implemented method of training a driver behavior simulator according to a geographical area, comprising:

Obtaining sensory data generated by a plurality of sensor sets mounted on a plurality of vehicles driven by a plurality of drivers in a geographical area. The sensor set comprising one or more motion sensors.

Analyzing the sensory data to identify a plurality of movement patterns indicative of a plurality of driver behavior patterns exhibited by the plurality of drivers.

Classifying at least some of the plurality of drivers to one of a plurality of driver behavior classes according to one of the plurality of driver behavior patterns detected for the each driver.

Calculating a driver behavior density function associated with the geographical area based on a recurrence of each of the plurality of driver behavior classes detected in the geographical area.

Updating a driver behavior simulator with the plurality of driver behavior classes and the driver behavior density function to generate realistic driver behavior data adapted to the geographical area for training an autonomous driving system.

Detecting driving behavior patterns and classes by analyzing large amounts of real world sensory data collected at a specific geographical area may allow characterizing the driving behavior at certain geographical areas, regions and/or the like. Using the identified driving behavior patterns and classes to enhance the virtual realistic model may allow adapting the virtual realistic model to specific geographical areas, regions and/or scenes making the virtual realistic model highly realistic.

In a further implementation form of the fourth aspect, the one or more motion sensors include, for example, a Global Positioning system (GPS) sensor, a gyroscope, an accelerometer, an Inertial Measurement Unit (IMU) sensor and an elevation sensor. The sensory motion and/or positioning data collected from the motion and/or positioning sensor(s) may express the movement of the vehicles. Therefore analyzing the sensory motion and/or positioning data may allow identifying the driving behavior patterns and classes demonstrated in the monitored geographical area.

In a further implementation form of the fourth aspect, the analysis is a statistics based prediction analysis conducted by an evolving learning algorithm using one or more machine learning algorithms which are members of a group consisting of: a neural network and a Support Vector Machine (SVM). Applying the machine learning algorithm(s) over large amounts of sensory data may significantly improve the characterization of driving behavior patterns and/or classes identified in the specific geographical area.

In a further implementation form of the fourth aspect, each of the plurality of driver behavior patterns comprises one or more motion parameters, for example, a speed parameter, an acceleration parameter, a breaking parameter, a direction parameter and an orientation parameter. The driving behavior pattern(s) may describe a plurality of motion parameters. Identifying the motion parameters, in particular using the machine learning algorithm(s) to detect the motion parameters may significantly improve the accuracy and/or granularity of the detected driving behavior patterns which may be further improve the virtual realistic model.

In an optional implementation form of the fourth aspect, the analysis of the sensory data is done according to one or more environmental characteristics detected during acquisition of the sensory data, for example, a weather condition attribute and a timing attribute. Naturally, the driving behavior demonstrated by the drivers may be affected by the environmental characteristics. Therefore analyzing the collected sensory ranging data with respect to the environmental conditions detected at the geographical area (the scene) may further increase accuracy of the identified driving behavior pattern(s).

In an optional implementation form of the fourth aspect, the analysis of the sensory data includes analyzing additional sensory data received from one or more outward sensors included in one or more of the plurality of sensor sets. The one or more outward sensors depicting the geographical area as viewed from one of the plurality of vehicles associated with the one or more sensor sets. Enhancing the collected sensory motion and/or positioning data with ranging data may significantly improve the characterization of the driver's prototype(s) detected in the geographical area.

In a further implementation form of the fourth aspect, the one or more outward sensors include, for example, a camera, a night vision camera, a LIDAR sensor, a radar and an ultra-sonic sensor. Using sensory data collected from a plurality of different range sensors may allow for more flexibility in analyzing the sensory ranging data.

In an optional implementation form of the fourth aspect, one or more of the plurality of driver behavior patterns is enhanced based on the analysis of the additional sensory data. The one or more enhanced driver behavior patterns comprise one or more additional driving characteristics, for example, a tailgating characteristic, an in-lane position characteristic and a double-parking tendency characteristic. Enhancing the driver behavior pattern(s) may allow a more accurate characterization of the driver prototype(s) detected in the geographical area and may thus improve the simulation created using the virtual realistic model.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DETAILED DESCRIPTION

Figure 1:
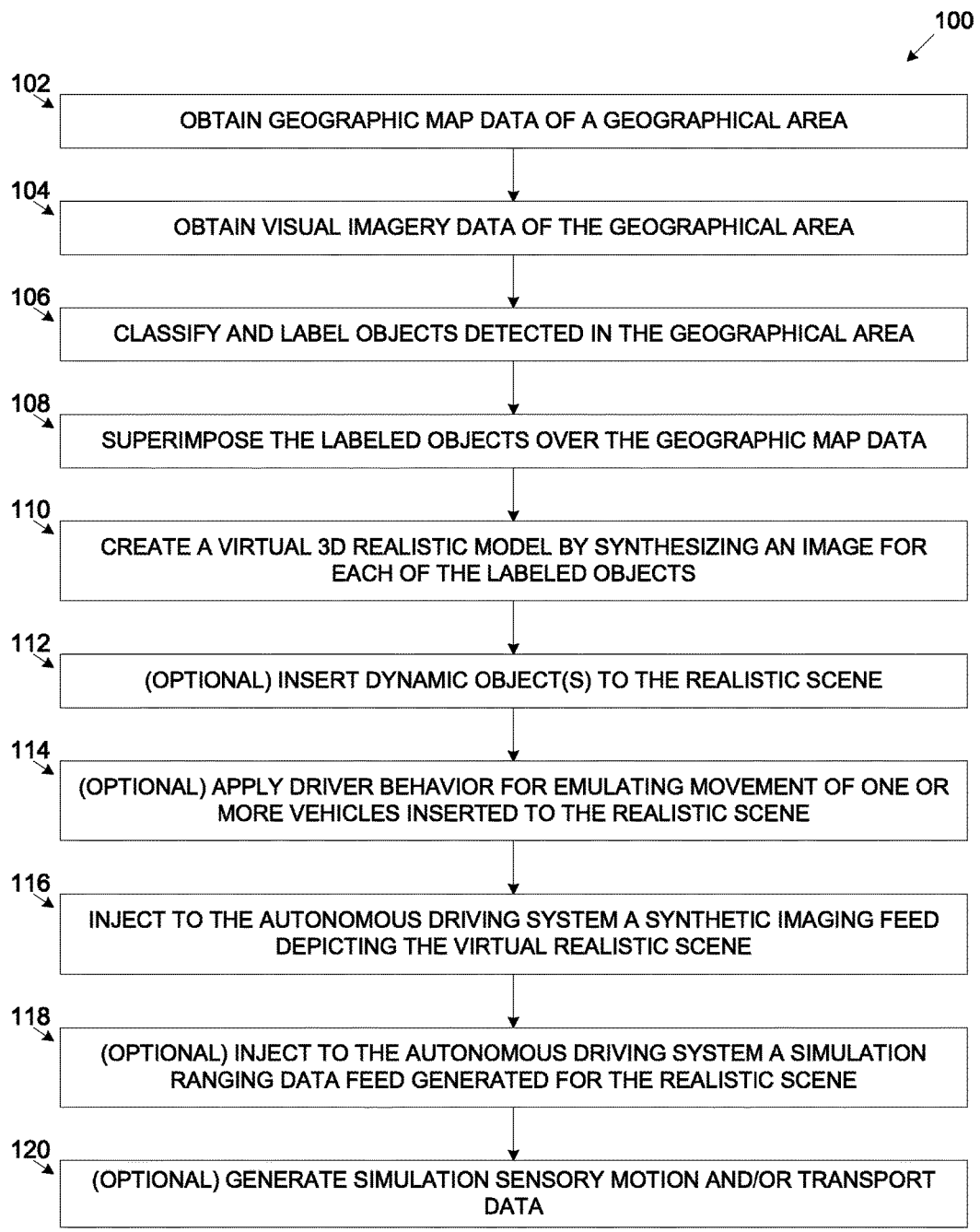
FIG. 1 is a flowchart of an exemplary process of creating a simulated virtual model of a geographical area, according to some embodiments of the present invention.

The present invention, in some embodiments thereof, relates to creating a simulated model of a geographical area, and, more specifically, but not exclusively, to creating a simulated model of a geographical area, optionally including transportation traffic to generate simulation sensory data for training an autonomous driving system.

According to some embodiments of the present invention, there are provided methods, systems and computer program products for training an autonomous driving system controlling a vehicle, for example, a ground vehicle, an aerial vehicle and/or a naval vehicle in a certain geographical area using a simulated virtual realistic model replicating the certain geographical area. The simulated virtual realistic model is created to emulate a sensory data feed, for example, imaging data, ranging data, motion data, transport data and/or the like which may be injected to the autonomous driving system during a training session. The virtual realistic model is created by obtaining visual imagery data of the geographical area, for example, one or more 2D and/or 3D images, panoramic image and/or the like captured at ground level, from the air and/or from a satellite. The visual imagery data may be obtained from, for example, Google Earth, Google Street View, OpenStreetCam, Bing maps and/or the like.

One or more trained classifiers (classification functions) may be applied to the visual imagery data to identify one or more (target) objects in the images, in particular static objects, for example, a road, a road infrastructure object, an intersection, a sidewalk, a building, a monument, a natural object, a terrain surface and/or the like. The classifier(s) may classify the identified static objects to class labels based on a training sample set adjusted for classifying objects of the same type as the target objects. The identified labeled objects may be superimposed over the geographic map data obtained for the geographical, for example, a 2D map, a 3D map, an orthophoto map, an elevation map, a detailed map comprising object description for objects present in the geographical area and/or the like. The geographic map data may be obtained from, for example, Google maps, OpenStreetMap and/or the like. The labeled objects are overlaid over the geographic map(s) in the respective location, position, orientation, proportion and/or the like identified by analyzing the geographic map data and/or the visual imagery data to create a labeled model of the geographical area. Using one or more techniques, for example, a Conditional Generative Adversarial Neural Network (cGAN), stitching texture(s) (of the labeled objects) retrieved from the original visual imagery data, overlaying textured images selected from a repository (storage) according to the class label and/or the like the labeled objects in the labeled model may be synthesized with (visual) image pixel data to create the simulated virtual realistic model replicating the geographical area. Optionally, the virtual realistic model is adjusted according to one or more lighting and/or environmental (e.g. weather, timing etc.) conditions to emulate various real world environmental conditions and/or scenarios, in particular, environmental conditions typical to the certain geographical area.

After the virtual realistic model is created, synthetic 3D imaging data may be created and injected to the autonomous driving system. In particular, the synthetic 3D imaging data may be generated to depict the virtual realistic model from a point of view of one or more emulated imaging sensors mounted on an emulated vehicle moving in the virtual realistic model. The emulated vehicle may be created in the virtual realistic model to represent a real world vehicle controlled by the autonomous driving system. Similarly, the emulated imaging sensor(s) emulate one or more imaging sensors, for example, a camera, a video camera, an infrared camera, a night vision sensor and/or the like which are mounted on the real world vehicle controlled by the autonomous driving system. Moreover, the emulated imaging sensor(s) may be created, mounted and/or positioned on the emulated vehicle according to one or more mounting attributes of the imaging sensor(s) mounting on the real world vehicle, for example, positioning (e.g. location, orientation, elevations, etc.), FOV, range, overlap region with adjacent sensor(s) and/or the like. In some embodiments, one or more of the mounting attributes may be adjusted for the emulated imaging sensor(s) to improve perception and/or capture performance of the imaging sensor(s). Based on analysis of the capture performance for alternate mounting options, one or more recommendation may be offered to the autonomous driving system for adjusting the mounting attribute(s) of the imaging sensor(s) mounting on the real world vehicle. The alternate mounting options may further suggest evaluating the capture performance of the imaging sensor(s) using another imaging sensor(s) model having different imaging attributes, i.e. resolution, FOV, magnification and/or the like.

Optionally, the virtual realistic model is enhanced with a sensory model created to simulate the certain geographical area, in particular, a ranging sensory model. Using the simulated ranging model, a simulated sensory ranging data feed may be injected to the autonomous driving system. The simulated sensory ranging data may be generated as depicted by one or more emulated range sensors mounted on the emulated vehicle to emulate one or more range sensor(s) mounted on the real world vehicle, for example, a Light Detection and Ranging (LIDAR) sensor, a radar, an ultrasonic sensor, a camera, an infrared camera and/or the like. The emulated range sensor(s) may be mounted on the emulated vehicle according to one or more mounting attributes of the real world range sensor(s) mounted on the real world vehicle controlled by the autonomous driving system and emulated by the emulated vehicle in the virtual realistic model.

Since the geographic map data as well as the visual imagery data is available for the certain geographical area, the ranging model created for the certain geographical area may be highly accurate. However, such accuracy may fail to represent real world sensory ranging data produced by real range sensor(s). The ranging sensory model may therefore apply one or more noise patterns typical and/or inherent to the range sensor(s) emulated in the virtual realistic model. The noise patterns may further include noise effects induced by one or more of the objects detected in the geographical area. The noise pattern(s) may describe one or more noise characteristics, for example, noise, distortion, latency, calibration offset and/or the like. The noise patterns(s) may be identified through big-data analysis and/or analytics over a large data set comprising a plurality of real world range sensor(s) readings collected for the geographical area and/or for other geographical locations. The big-data analysis may be done using one or more machine learning algorithms, for example, a neural network such as, for instance, a Deep learning Neural Network (DNN), a Gaussian Mixture Model (GMM), etc., a Support Vector Machine (SVM) and/or the like. Optionally, in order to more accurately simulate the geographical area, the noise pattern(s) may be adjusted according to one or more object attributes of the objects detected in the geographical area, for example, an external surface texture, an external surface composition, an external surface material and/or the like. The noise pattern(s) may also be adjusted according to one or more environmental characteristics, for example, weather, timing (e.g. time of day, date) and/or the like. In some embodiments, one or more mounting attributes may be adjusted for the emulated range sensor(s) to improve accuracy performance of the range sensor(s).

Optionally, one or more dynamic objects are injected into the virtual realistic model replicating the geographical area, for example, a ground vehicle, an aerial vehicle, a naval vehicle, a pedestrian, an animal, vegetation and/or the like. The dynamic object(s) may further include dynamically changing road infrastructure objects, for example, a light changing traffic light, an opened/closed railroad gate and/or the like. Movement of one or more of the dynamic objects may be controlled according to movement patterns predefined and/or learned for the certain geographical area.

In particular, movement of one or more ground vehicles inserted into the virtual realistic model may be controlled according to driver behavior data received from a driver behavior simulator. The driver behavior data may be adjusted according to one or more driver behavior patterns and/or driver behavior classes exhibited by a plurality of drivers in the certain geographical area, i.e. driver behavior patterns and/or driver behavior classes that may be typical to the certain geographical area. The driver behavior classes may be identified through big-data analysis and/or analytics over a large data set of sensory data, for example, sensory motion data, sensory ranging data and/or the like collected from a plurality of drivers moving in the geographical area. The sensory data may include, for example, speed, acceleration, direction, orientation, elevation, space keeping, position in lane and/or the like. One or more machine learning algorithms, for example, a neural network (e.g. DNN, GMM, etc.), an SVM and/or the like may be used to analyze the collected sensory data to detect movement patterns which may be indicative of one or more driver behavior patterns. The driver behavior pattern(s) may be typical to the geographical area and therefore, based on the detected driver behavior pattern(s), the drivers in the geographical area may be classified to one or more driver behavior classes representing driver prototypes. The driver behavior data may be further adjusted according to a density function calculated for the geographical area which represents the distribution of the driver prototypes in the simulated geographical area.

Optionally, additional data relating to the emulated vehicle is simulated and injected to the autonomous driving system. The simulated additional data may include, for example, sensory motion data presenting motion information of emulated vehicle, transport data simulating communication of the emulated vehicle with one or more other entities over one or more communication links, for example, Vehicle to Anything (V2X) and/or the like.

The simulated sensory data, such as the imaging data, the ranging data, the motion data and/or the transport data may be injected to the autonomous driving system using the native interfaces of the autonomous driving system. For example, in case the autonomous driving system is a unit having one or more interfaces, ports, links and/or the like, the simulated sensory data may be injected through the interface(s), port(s) and/or links. Additionally and/or alternatively, assuming the autonomous driving system is a computer software program, the simulated sensory data may be injected using one or more virtual drivers using, for example, Application Programming Interface (API) functions of the autonomous driving system, a Software Development Kit (SDK) provided for the autonomous driving system and/or for the training system and/or the like.

Training autonomous driving systems using the simulated virtual realistic model emulating one or more geographical areas, specifically, a simulated virtual realistic model for emulating sensory data such as the imaging data, sensory data, motion data and/or transport data may present significant advantages. The simulated virtual realistic model may be further used for evaluating, validating and/or improving design of autonomous driving systems.

Currently, autonomous driving systems are typically designed, trained, evaluated and validated in real world conditions in which a real world vehicle controlled by the autonomous driving system is moving in the real world geographical area. This may present major limitations since an extremely large number of driving hours may need to be accumulated in order to properly train and/or evaluate the autonomous driving systems. Moreover, the vehicle controlled by the autonomous driving system needs to be driven in a plurality of geographical locations which may further limit scalability of the training, evaluation and/or validation process. Furthermore, the autonomous driving system may need to be evaluated and/or trained for a plurality of environmental conditions, for example, weather conditions, timing conditions, lighting condition and/or the like as well as for a plurality of traffic conditions, for example, standard traffic, rush hour traffic, vacation time traffic and/or the like. This may further limit scalability of the training, evaluation and/or validation process. In addition, driver behavior of other vehicles may vary with respect to one or more conditions, for example, different geographical areas, different environmental conditions, different traffic conditions and/or the like. This may also limit scalability of the training, evaluation and/or validation process. The limited scalability of the currently existing methods may further result from the enormous amount of resources that may be required to train, evaluate and/or validate the autonomous driving systems in the plurality of ride scenarios, for example, time, hardware resources, human resources and/or the like.

Training the autonomous driving systems using the simulated virtual realistic model on the other hand, may allow for significant scalability since the plurality of various ride scenarios may be easily simulated for a plurality of geographical locations. The training, evaluation and/or validation process may be done automatically by an automated system executing the simulated virtual realistic model. Moreover, the training, evaluation and/or validation process may be done for a plurality of geographical area, various conditions and/or various scenarios in a closed facility without the need to move real vehicles in the real world. In addition, the automated training, evaluation and/or validation process may be conducted concurrently for the plurality of geographical area, the various conditions and/or the various scenarios. This may significantly reduce the resources, for example, time, hardware resources, human resources and/or the like for training, evaluating and/or validating the autonomous driving systems.

Moreover, using the automated system executing the simulated virtual realistic model for training, evaluating and/or validating the autonomous driving systems may significantly reduce risk since the process is conducted in a virtual environment. Damages, accidents and even life loss which may occur using the currently existing methods for training the autonomous driving systems may be completely prevented and avoided.

Furthermore, the autonomous driving system may require insignificant and typically no adaptations to support training, evaluation and/or validation using the simulated virtual realistic model. The simulated sensory data feed(s) depicting the simulated virtual realistic model may be injected to the autonomous driving systems through the native interface used by the autonomous driving system to receive real sensory data.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages.

The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Referring now to the drawings, FIG. 1 is a flowchart of an exemplary process of creating a simulated model of a geographical area, according to some embodiments of the present invention. A process 100 may be executed to train an autonomous driving system in a certain geographical area using a simulated virtual 3D model created to replicate the geographical area. The simulated virtual realistic model is created by obtaining visual imagery data of the geographical area which may be processed by one or more trained classifiers to identify one or more objects in the visual imagery data, in particular static objects. The identified objects may be superimposed over geographic map(s) obtained for the geographical area to create a labeled model of the geographical area. Using one or more techniques, for example, a cGAN, stitching texture(s) (of the labeled objects) retrieved from the original visual imagery data, overlaying textured images selected from a repository according to the class label and/or the like the labeled model may be synthesized to create the virtual 3D realistic model replicating the geographical area. Optionally, the virtual realistic model is adjusted according to one or more lighting and/or environmental conditions to emulate various real world lighting effects, weather conditions, ride scenarios and/or the like.

After the virtual realistic model is created, synthetic 3D imaging data may be created and injected to the autonomous driving system. In particular, the synthetic 3D imaging data may be generated to depict the virtual realistic model from a point of view of one or more emulated imaging sensors (e.g. a camera, an infrared camera, a video camera, a night vision sensor, etc.) mounted on an emulated vehicle moving in the virtual realistic model which represents the vehicle controlled by the autonomous driving system.

Optionally, a ranging model is simulated for the geographical area to emulate a realistic ranging arena in the simulated virtual realistic model.

Optionally, one or more dynamic objects are injected into the virtual realistic model replicating the geographical area, for example, a ground vehicle, an aerial vehicle, a naval vehicle, a pedestrian, an animal, vegetation and/or the like. Moreover, movement of one or more ground vehicles inserted to the virtual realistic model may be controlled according to driver behavior patterns identified through big-data analytics of vehicles movement in the geographical area.

Figure 2A:
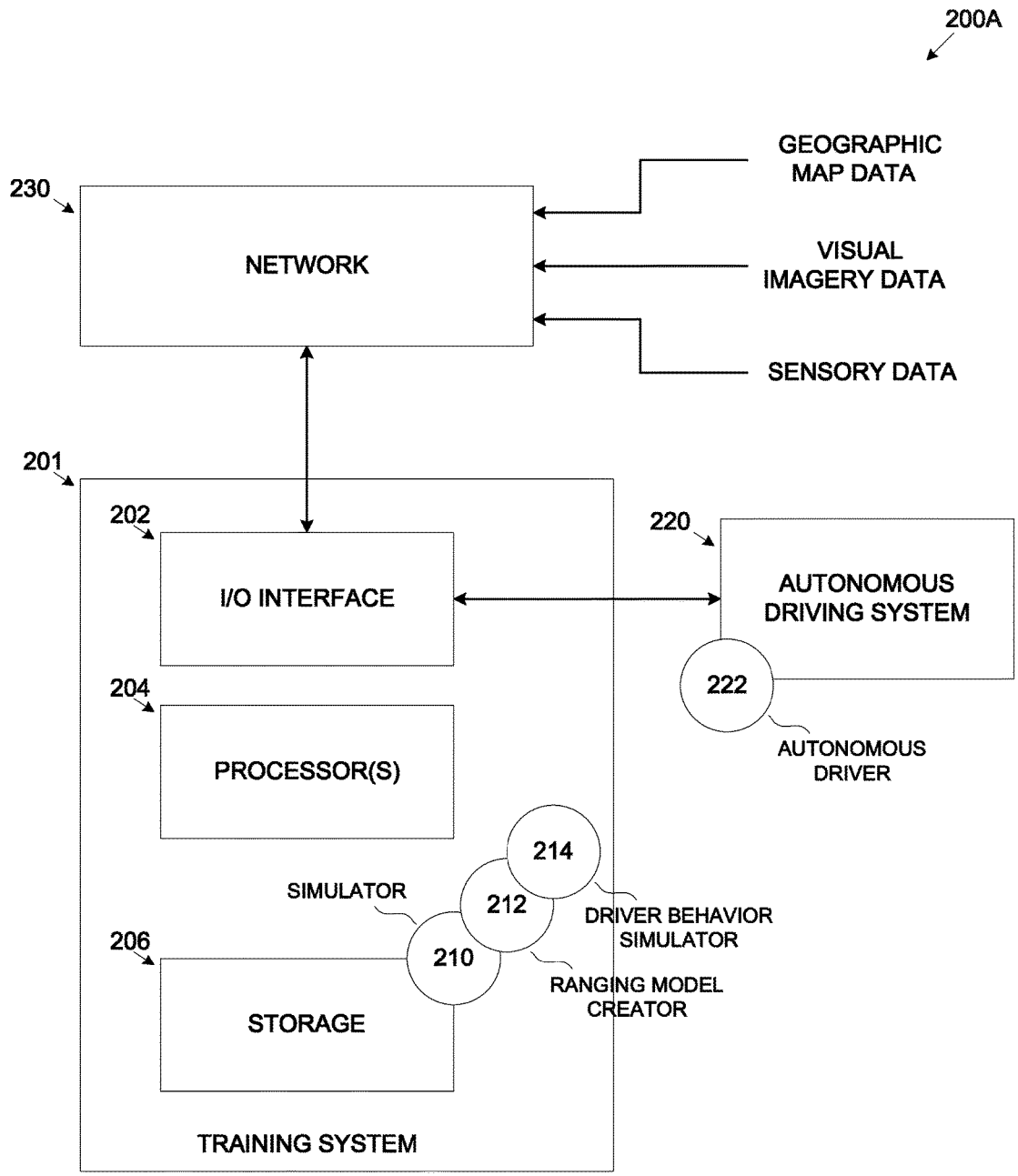
FIG. 2A and FIG. 2B are schematic illustrations of an exemplary embodiments of a system for creating a simulated virtual model of a geographical area, according to some embodiments of the present invention.
Figure 2B:
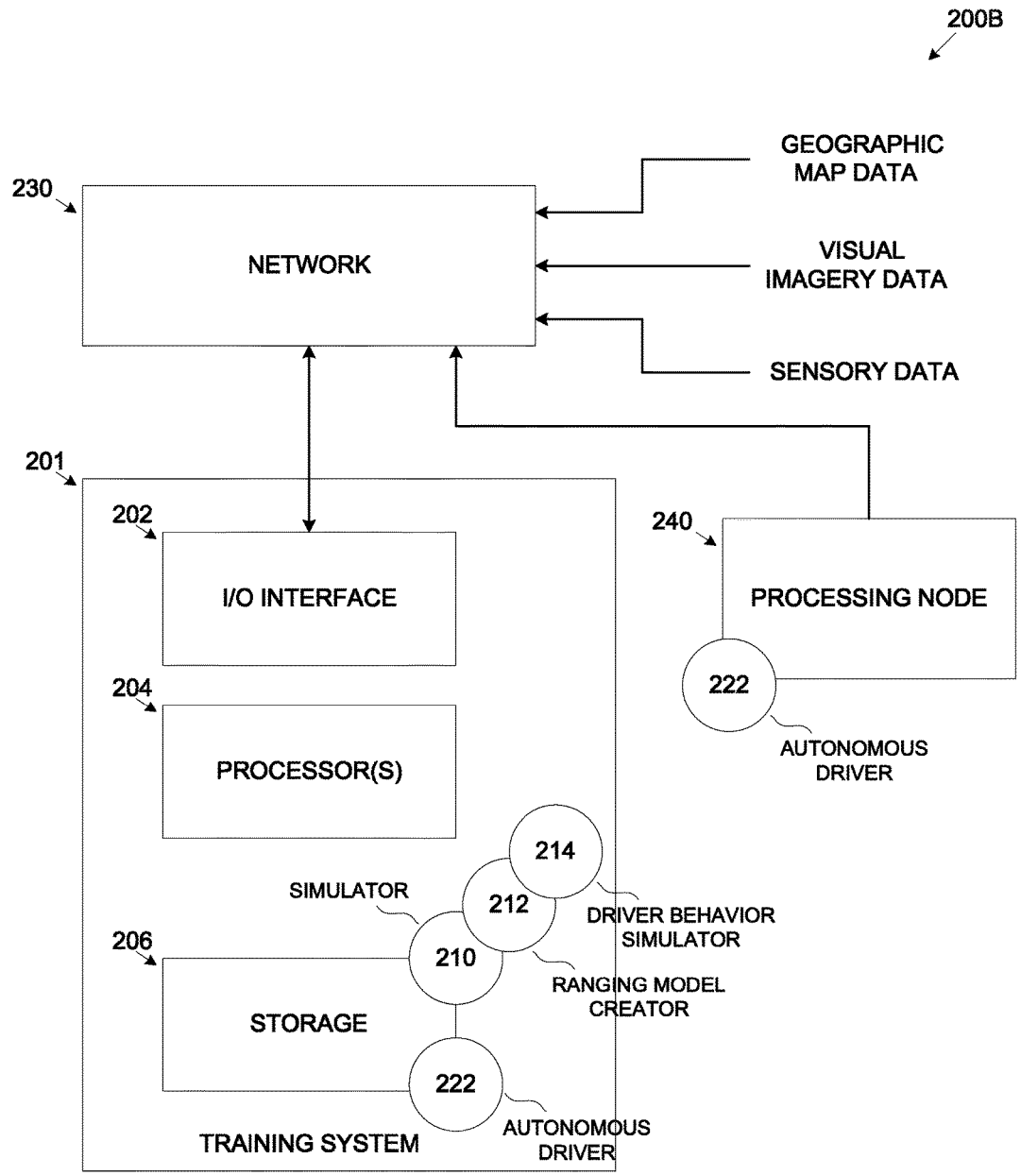

Reference is also made to FIG. 2A and FIG. 2B, which are schematic illustrations of exemplary embodiments of a system for creating a simulated model of a geographical area, according to some embodiments of the present invention. An exemplary system 200A includes a simulation server 201 comprising an Input/Output (I/O) interface 202, a processor(s) 204 and a storage 206. The I/O interface 202 may provide one or more network interfaces, wired and/or wireless for connecting to one or more networks 230, for example, a Local Area Network (LAN), a Wide Area Network (WAN), a Metropolitan Area Network (MAN), a cellular network and/or the like. The processor(s) 204, homogenous or heterogeneous, may be arranged for parallel processing, as clusters and/or as one or more multi core processor(s). The storage 206 may include one or more non-transitory persistent storage devices, for example, a hard drive disk (HDD), a Solid State Disk (SSD) a Flash array and/or the like. The storage 206 may further include one or more networked storage resources accessible over the network(s) 230, for example, a Network Attached Storage (NAS), a storage server, a cloud storage and/or the like. The storage 206 may also utilize one or more volatile memory devices, for example, a Random Access Memory (RAM) device and/or the like for temporary storage of code and/or data. The processor(s) 204 may execute one or more software modules, for example, a process, a script, an application, an agent, a utility and/or the like which comprise a plurality of program instructions stored in a non-transitory medium such as the storage 206. The processor(s) 204 may execute one or more software modules such as, for example, a simulator 210 for training an autonomous driving system 220 using a simulated model created to replicate one or more geographical areas, a ranging model creator 212 for creating a ranging model of the geographical area(s), and a driver behavior simulator 214 simulating driver behavior in the geographical area(s). Optionally, one or more of the simulator 210, the ranging model creator 212 and/or the driver behavior simulator 214 are integrated in a single software module. For example, the simulator 210 may include the ranging model creator 212 and/or the driver behavior simulator 214. The simulator 210, the ranging model creator 212 and/or the driver behavior simulator 214 may communicate over the network(s) 230 to obtain, retrieve, receive and/or collect data, for example, geographic map data, visual imagery data, sensory data and/or the like from one or more remote locations.

Optionally, the simulation server 201 and/or part thereof is implemented as a cloud based platform utilizing one or more cloud services, for example, cloud computing, cloud storage, cloud analytics and/or the like. Furthermore, one or more of the software modules, for example, the simulator 210, the ranging model creator 212 and/or the driver behavior simulator 214 may be implemented as a cloud based service and/or platform, for example, software as a service (SaaS), platform as a service (PaaS) and/or the like.

The autonomous driving system 220 may include an I/O interface such as the I/O interface 202, one or more processors such as the processor(s) 240, and a storage such as the storage 206. The I/O interface of the autonomous driving system 220 may provide a plurality of I/O and/or network interfaces for connecting to one or more peripheral devices, for example, sensors, networks such as the network 230 and/or the like. In particular, the I/O interface of the autonomous driving system 220 may provide connectivity to one or more imaging sensors, ranging sensors, motion sensors, V2X communication links, vehicle communication links (e.g. Controller Area Network (CAN), etc.) and and/or the like.

The I/O interface 202 may further include one or more interfaces adapted and/or configured to the native I/O interfaces of the I/O interface of the autonomous driving system 220. For example, the I/O interface 202 may include one or more output links compliant with one or more input links of the I/O interface of the autonomous driving system 220 such that an imaging data feed may be driven from the simulator system 201 to the autonomous driving system 220. Similarly, the I/O interface 202 may provide connectivity to the autonomous driving system 220 to drive ranging sensory data, motion sensory data, transport data and/or the like. The communication between the simulation server 201 and the autonomous driving system 220 may support bidirectional communication from the simulation server 201 to the autonomous driving system 220 and vice versa.

The autonomous driving system 220 may execute one or more software modules such as, for example, an autonomous driver 222 for controlling movement, navigation and/or the like of a vehicle, for example, a ground vehicle, an aerial vehicle and/or a naval vehicle.

In some embodiments, as shown in system 200B, the autonomous driving system 220 may be facilitated through the autonomous driver 222 independent of the autonomous driving system 220. The autonomous driver 222 may be executed by one or more processing nodes, for example, the simulation server 201, another processing node 240 connected to the network 230 and/or the like. In such implementations and/or deployments, one or more of the software modules executed by the simulation server, for example, the simulator 210 may communicate with the autonomous driver 222 through one or more software interfaces of the autonomous driver 222 which are typically used to receive the imaging data feed, the ranging sensory data, the motion sensory data, the transport data and/or the like. The software interface(s) may include, for example, a virtual driver, an API function, a system call, an operating system function and/or the like. The communication between the simulator 210 and the autonomous driver 222 may also be established using one or more SDKs provided for the autonomous driver 222 and/or for the simulator 210. In case the autonomous driver 222 is executed at a remote processing node such as the processing node 240, the simulator 210 and the autonomous driver 222 may communicate with each other using the software interfaces which may be facilitated over one or more of networks such as the networks 230.

As shown at 102, the process 100 starts with the simulator 210 obtaining geographic map data of one or more geographical areas, for example, an urban area, an open terrain area, a country side area and/or the like. In particular, the simulator 210 obtains the geographic map data for a geographical area targeted for training an autonomous driving system such as the autonomous driving system 220 and/or autonomous driver such as the autonomous driver 222. The geographic map data may include one or more maps, for example, a 2D map, a 3D map, an orthophoto map, an elevation map, a detailed map comprising object description for objects present in the geographical area and/or the like. The geographic map data may be obtained from one or more geographic map sources, for example, Google maps, OpenStreetMap and/or the like. The geographic map data may present one or more static objects located in the geographical area, for example, a road, a road infrastructure object, a building, a monument, a structure, a natural object, a terrain surface and/or the like. The geographic map data may include, for example, road width, structure(s) contour outline, structure(s) polygons, structure(s) dimensions (e.g. width, length, height) and/or the like. The simulator 210 may retrieve the geographic map data from the storage 206 and/or from one or more remote location accessible over the network(s) 230.

As shown at 104, the simulator 210 obtains visual imagery data of the target geographical area. The visual imagery data may include one or more 2D and/or 3D images depicting the geographical area from ground level, from the air and/or from a satellite. The simulator 210 may retrieve the geographic map data from the storage 206 and/or from one or more remote location accessible over the network(s) 230. The simulator 210 may obtain the visual imagery data from one or more visual imagery sources, for example, Google Earth, Google Street View, OpenStreetCam and/or the like.

As shown at 106, the simulator 210 labels the static objects detected in the imagery data. The simulator 210 may use one or more computer vision classifiers (classification functions), for example, a Convolutional Neural Network (CNN), an SVM and/or the like for classifying the static object(s) detected in the visual imagery data to predefined labels as known in the art. In particular, the classifier(s) may identify and label target static objects depicted in the visual imagery data, for example, a road infrastructure object, a building, a monument, a structure, a natural object, a terrain surface and/or the like. The road infrastructure objects may include, for example, roads, road shoulders, pavements, intersections, interchanges, traffic lights, pedestrian crossings and/or the like. The classifier(s) may typically be trained with a training image set adapted for the target static object defined to be recognized in the imagery data, for example, the road infrastructure object, the building, the monument, the structure, the natural object, the terrain surface and/or the like. In order to improve generalization and avoid overfitting, the training image set may be collected, constructed, adapted, augmented and/or transformed to present features of the static objects in various types, sizes, view angles, colors and/or the like.

Optionally, prior to analyzing the visual imagery data to identify the static objects, the simulator 210 applies noise removal to the visual imagery data to remove unnecessary objects, for example, vehicles, animals, vegetation and/or the like that may obscure (at least partially) the target static objects. The simulator 210 may further apply one or more image processing algorithms to improve and/or enhance visibility of the static objects depicted in the imagery data, for example, adjust image brightness, adjust image color scheme, adjust image contrast and/or the like.

As shown at 108, the simulator 210 superimposes the labeled static objects over the geographic map data, for example, the geographic map(s) to create a labeled model of the geographical area. The simulator 210 may overlay, fit, align, adjust and/or the like the labeled objects over the geographic map(s) in the respective location, position, orientation, proportion and/or the like as identified by analyzing the geographic map data and/or the visual imagery data. The simulator 210 may associate each of the labeled static objects detected in the visual imagery data with one or more positioning attributes extracted from the geographic map data and/or the visual imagery data, for example, location, position, elevation, orientation, proportion and/or the like. Using the positioning attributes, the simulator 210 may position (i.e. locate, orient, align, adjust, manipulate and/or the like) the labeled static objects in the geographic map(s). The resulting labeled model may therefore replicate the real world geographical area such that the labeled objects accurately placed and/or located according to real world place, location, position, elevation, orientation and/or the like. The simulator 210 may further create an elevation model that is integrated with the labeled model.

As shown at 110, the simulator 210 synthesizes the labeled model to assign (visual) image pixel data to each of the labeled static objects in the labeled model to create a virtual 3D visual realistic scene replicating the geographical area. The simulator 210 may apply one or more methods, techniques and/or implementations for synthesizing the labeled scene.

In one implementation, the simulator 210 may use one or more machine learning methodologies, techniques and/or algorithms, for example, a cGAN and/or the like to synthesize one or more of the labeled objects. The cGAN, as known in the art, may be trained to apply a plurality of visual data transformations, for example, pixel to pixel, label to pixel and/or the like. The cGAN may therefore generate visual appearance imagery (e.g. one or more images) for each of the labels which classify the static object(s) in the labeled model. The cGAN may be trained to perform the reverse operation of the classifier(s) (classification function) such that the cGAN may generate a corresponding visual imagery for label(s) assigned by the classifier(s) to one or more of the static objects in the labeled model. For example, assuming the simulator 210 identified a road object in the visual imagery data of the geographical area and labeled the road object in the labeled scene. The simulator 210 may apply the cGAN(s) to transform the road label of the road object to a real world visual appearance imagery of the road object.

In another implementation, the simulator 210 may use the original visual imagery data to extract the texture of one or more of the labeled objects. For example, assuming the simulator 210 identified the road object in the visual imagery data of the geographical area and labeled the road object in the labeled scene. The simulator 210 may extract the texture of the road object from the original visual imagery data and overlay the road object texture on the road object label in the labeled scene.

In another implementation, the simulator 210 may use retrieve the texture of one or more of the labeled objects from a repository comprising a plurality of texture images of a plurality of objects. The repository may be facilitated through e or more storage locations, for example, the storage 206 and/or one or more remote storage locations accessible over the network 230. For example, assuming the simulator 210 identified the road object in the visual imagery data of the geographical area and labeled the road object in the labeled scene. The simulator 210 may access the storage location(s) to retrieve the texture of the road object and overlay the road object texture on the road object label in the labeled scene.

Moreover, the simulator 210 may manipulate, for example, increase, decrease, stretch, contract, rotate, transform and/or the like the labeled object(s)' texture extracted for the visual imagery data to fit the location, size, proportion and/or perspective of the labeled object(s) in the labeled scene. For example, the simulator 210 may manipulate the road object texture to fit the road object location, size and/or perspective in the labeled scene as depicted from a certain point of view.

The simulator 210 may apply one or more computer graphics standards, specifications, methodologies and/or the like for creating and/or rendering the virtual 3D visual realistic model, for example, OpenGL, DirectX and/or the like.

The resulting virtual 3D visual realistic model may be significantly accurate in visually replicating the geographical area. The virtual 3D visual realistic model may therefore be highly suitable for training the autonomous driver 222 for controlling movement of an emulated vehicle, for example, a ground vehicle, an aerial vehicle, a naval vehicle and/or the like in the simulated realistic model replicating the geographical area.

Optionally, the simulator 210 adjusts the simulated realistic model to simulate one or more environmental conditions, for example, a lighting condition, a timing condition, a weather condition and/or the like. For example, the simulator 210 may adjust the lighting conditions of the simulated realistic model according to a time of day and/or a date, i.e. according to an angle of the sun in the sky. In another example, the simulator 210 may adjust the lighting conditions of the simulated realistic model according to a weather condition, for example, an overcast, cloudy sky, fog and/or the like. In another example, the simulator 210 may simulate rain drops, snow flakes and/or the like to simulate respective weather conditions.

As shown at 112, which is an optional step, the simulator 210 may insert one or more simulated dynamic objects to the simulated virtual realistic model. The simulated dynamic objects may include for example, a ground vehicle, an aerial vehicle, a naval vehicle, a pedestrian, an animal, vegetation and/or the like. The simulated dynamic objects may further include one a dynamically changing road infrastructure object, for example, a light changing traffic light, an opened/closed railroad gate and/or the like. The simulator 210 may apply one or more movement and/or switching patterns to one or more of the simulated dynamic objects to mimic the real world dynamic objects behavior. For example, the simulator 210 may insert a simulated aircraft to the simulated virtual realistic model and controls the simulated aircraft to fly in a valid flight lane as exists in the geographical area. In another example, the simulator 210 may place one or more simulated traffic lights at an intersection detected in the geographical area. The simulator 210 may control the simulated traffic light(s) to switch lights in accordance with traffic control directives applicable to traffic light(s) in the geographical area. The simulator 210 may further synchronize switching of multiple simulated traffic lights to imitate real traffic control as applied in the geographic area.

As shown at 114, which is an optional step, assuming the simulator 210 inserted one or more emulated ground vehicles to the simulated virtual realistic model, the simulator 210 may use a driver behavior simulator to control one or more of the emulated ground vehicles according to one or more driver behavior classes and/or patterns identified at the geographical area. The driver behavior classes may include, for example, an aggressive driver, a normal driver, a patient driver, a reckless driver and/or the like. Moreover, assuming the simulator 210 emulates a plurality of vehicles in the virtual realistic model, the simulator 210, using the driver behavior simulator, may apply the driver behavior classes according to a density function calculated for the geographical area which represents the distribution of the driver prototypes (classes) detected in the geographical area replicated by the virtual realistic model. This may allow accurate simulation of the virtual realistic model which may thus be significantly similar to the real world geographical area with respect to driving behavior typical to the geographical area.

Figure 3:
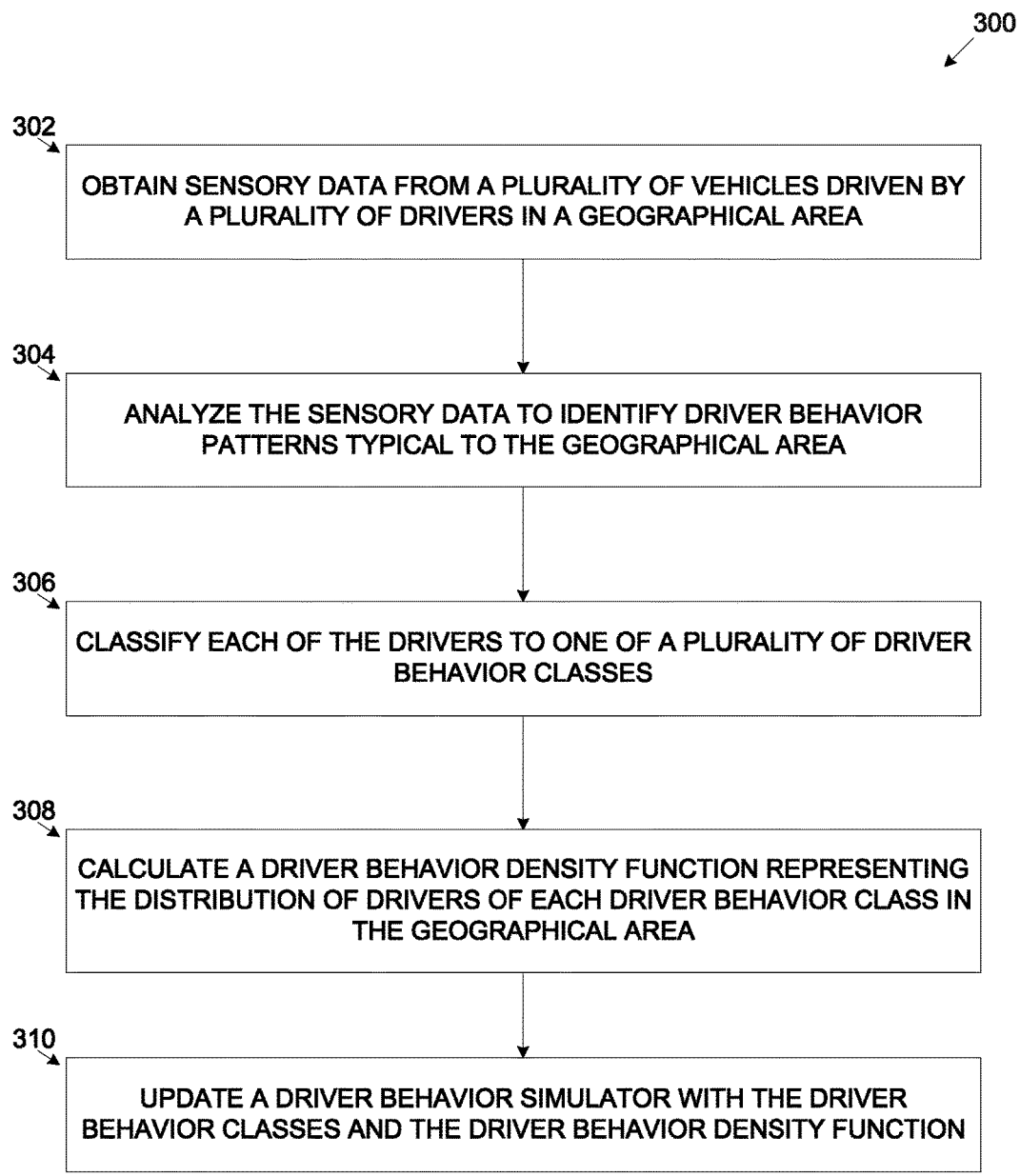
FIG. 3 is a flowchart of an exemplary process of training a driver behavior simulator for a certain geographical area, according to some embodiments of the present invention.

Reference is no made to FIG. 3, which is a flowchart of an exemplary process of training a driver behavior simulator for a certain geographical area, according to some embodiments of the present invention. An exemplary process 300 may be executed by a driver behavior simulator such as the driver behavior simulator 214 in a system such as the system 200 for training the driver behavior simulator 214 according to driver behavior characteristics detected in the geographical area. While the process 300 may be applied in a plurality of geographical areas for training the driver behavior simulator 214, for brevity, the process 400 is described for a single geographical location. The driver behavior simulator 214 may be used by a simulator such as the simulator 210 to simulate movement of emulated vehicles in a simulated virtual realistic model replicating the geographical area.

As shown at 302, the process 300 starts with the driver behavior simulator 214 obtaining sensory data from a plurality of sensor sets mounted on a plurality of vehicles driven by a plurality of drivers in the geographical area. In particular, the sensory data may include sensory motion data obtained from one or more motion sensors of the sensor set, for example, a Global Positioning system (GPS) sensor, a gyroscope, an accelerometer, an Inertial Measurement Unit (IMU) sensor, an elevation sensor and/or the like.

As shown at 304, the driver behavior simulator 214 may analyze the sensory data to detect movement patterns of each of the plurality of vehicles in the geographical area. The driver behavior simulator 214 may apply big-data analysis and/or analytics using one or more machine learning algorithms, for example, a neural network (e.g. DNN, GMM, etc.), an SVM and/or the like to analyze large amounts of sensory data collected from the vehicles riding in the geographical areas and detect the movement patterns.

The detected movement patterns may be indicative of one or more driver behavior patterns exhibited by one or more of the drivers driving the vehicles in the geographical area. The driver behavior simulator 214 may therefore analyze the detected movement patterns to infer the driver behavior pattern(s). The driver behavior simulator 214 may again apply the machine learning algorithm(s) to identify the driver behavior pattern(s) from analysis of the movement patterns.

The driver behavior pattern(s) may include one or more motion parameters, for example, a speed parameter, an acceleration parameter, a breaking parameter, a direction parameter, an orientation parameter and/or the like. Moreover, the driver behavior pattern(s) may be associated with specific locations of interest, for example, an intersection, a road curve, a turning point, an interchange entrance/exit ramp and/or the like. The driver behavior pattern(s) may describe one or more of the motion parameters for the location of interest. Furthermore, the driver behavior simulator 214 may create one or more driver behavior pattern(s) to describe a prolonged driving action, for example, crossing the intersection such that the driver behavior pattern(s) may specify, for example, a speed parameter for the intersection entry phase, a speed parameter for the intersection crossing phase, a speed parameter for the intersection exit phase and/or the like. In another example, the driver behavior pattern(s) may describe a direction and/or orientation parameter for one or more phase while exiting the interchange on the exit ramp. In another example, the driver behavior pattern(s) may describe an acceleration parameter for one or more phases while entering the interchange entrance ramp.

Optionally, the driver behavior simulator 214 analyzes the sensory data with respect to one or more environmental characteristics detected during acquisition of the sensory data, for example, a weather condition attribute, a timing attribute and/or the like. The environmental characteristics may affect the driving behavior exhibited by at least some of the drivers and the driver behavior simulator 214 may therefore adapt, create and/or amend the driver behavior pattern(s) according to the environmental characteristic(s). For example, the driver behavior may differ between night and day, between summer and winter and/or the like. Therefore, based on the timing attribute associated with the sensory data, the driver behavior simulator 214 may create the driver behavior pattern(s) to distinguish between day and night, summer and winter and/or the like. In another example, the driver behavior may change in case of wind, rain, fog, snow and/or the like. Therefore, based on the weather attribute associated with the sensory data, the driver behavior simulator 214 may create the driver behavior pattern(s) for each of the weather conditions.

Optionally, the sensory data comprises additional sensory data obtained from one or more outward sensors included in one or more of the sensor sets mounted on the plurality of vehicles. The outward sensor(s) depict the geographical area as viewed from one of the plurality of vehicles associated with the respective sensor set(s). The outward sensor(s) may include, for example, a camera, an infrared camera, a night vision sensor, a LIDAR sensor, a radar, an ultra-sonic sensor and/or the like. By analyzing the additional sensory data, the driver behavior simulator 214 may detect further movement patterns, driver behavior patterns and/or additional driving characteristics of the drivers of the vehicles in the geographical area and may enhance one or more of the driver behavior patterns accordingly. The additional driving characteristics may include, for example, a tailgating characteristic, an in-lane position characteristic, a double-parking tendency characteristic and/or the like. For example, based on analysis of imagery data, for example, one or more images received from the imaging sensor(s), the driver behavior simulator 214 may detect double parking events and may thus associate one or more of the driver behavior patterns with the double-parking tendency characteristic. In another example, based on analysis of sensory ranging data received from the range sensor(s), the driver behavior simulator 214 may identify space keeping parameters, in-lane position parameters and may thus associate one or more of the driver behavior patterns with the tailgating characteristic, the in-lane position characteristic and/or the like.

The driver behavior simulator 214 may associate at least some of the drivers with one or more of the driver behavior patterns detected for the vehicles' drivers in the geographical area.

As shown at 306, the driver behavior simulator 214 may classify at least some of the plurality of drivers to one or more driver behavior classes according to the driver behavior pattern(s) associated with each of the drivers. The driver behavior classes may include, for example, an aggressive driver prototype, a normal driver prototype, a patient driver prototype, a reckless driver prototype and/or the like. The driver behavior simulator 214 may use one or more classification, clustering and/or grouping methods, techniques and/or algorithms for classifying the drivers to the driver behavior classes.

As shown at 308, the driver behavior simulator 214 may calculate a driver behavior density function associated with the geographical area and/or pat thereof. The driver behavior density function describes a probability of presence and/or distribution (number) of each of the driver prototypes in the geographical area (or part thereof) at a certain time. The driver behavior simulator 214 may calculate the driver behavior density function according to a distribution and/or recurrence of drivers of each of the driver prototypes in the geographical area. The driver behavior simulator 214 may further adjust the calculated driver behavior density function according to one or more of the environmental conditions. For example, the number of driver of certain driver prototype may differ between day and night, for example, more reckless drivers (young people) at night while more normal drivers (people driving to work places) during the day. In another example, during rainy weather conditions, the number of reckless drivers may decrease. The driver behavior simulator 214 may therefore adjust the driver behavior density function accordingly.

As shown at 310, the driver behavior simulator 214 may be updated with the driver behavior classes and/or the driver behavior density function detected and/or calculated for the geographical area to generate realistic driver behavior data adapted to the geographical area for training the autonomous driving system 220 and/or the autonomous driver 222. The driver behavior simulator 214 may thus be used by the simulator 210 to simulate movement of the vehicles emulated in the simulated virtual realistic model replicating the geographical area to further impersonate the real world simulation.

Reference is made once again to FIG. 1. As shown at 116, the simulator 210 may generate synthetic 3D imaging data, for example, one or more 2D and/or 3D images of the virtual realistic model replicating the geographical area. The simulator 210 may generate the synthetic 3D imaging data using the functions, utilities, services and/or abilities of the graphic environment, for example, OpenGL, DirectX and/or the like used to generate the simulated virtual realistic model. The simulator 210 may create the synthetic 3D imaging data to depict the virtual realistic model as viewed by one or more emulated imaging sensors, for example, a camera, a video camera, an infrared camera, a night vision sensor and/or the like mounted on the emulated vehicle moving in the simulated virtual realistic model. The emulated imaging sensor(s) may be mounted on the emulated vehicle according to one or more mounting attributes, for example, positioning on the emulated vehicle (e.g. location, orientation, elevations, etc.), FOV, range, overlap region with at least one adjacent range sensor and/or the like of the real imaging sensor(s) mounted on the real vehicle controlled by the autonomous driver 222. The simulator 210 may inject, provide and/or transmit the synthetic 3D imaging data to the autonomous driving system 220 which may thus be trained to move the emulated vehicle in the simulated virtual realistic model which may appear to the autonomous driving system 220 as the real world geographical area. The imaging data may be injected to the training autonomous driving system as a feed to one or more of the hardware and/or software interfaces used by the autonomous driving system 220 and/or the autonomous driver 222 as described herein above which may be natively used to receive the imaging data feed from the imaging sensor(s) mounted on the controlled vehicle.

Optionally, the simulator 210 may analyze the synthetic 3D imaging data to evaluate a perception performance of the imaging sensor(s). The simulator 210 may evaluate the perception performance of the imaging sensor(s) while applying alternate values to one or more mounting attributes of the imaging sensor(s). The simulator 210 may determine optimal settings for the mounting attribute(s) and may recommend the autonomous driving system and/or the autonomous driver 222 to apply the optimal settings. Based on the offered settings, the designer(s) of the autonomous driving system 220 may take one or more actions, for example, adjust one or more of the imaging sensor(s) mounting attributes, use different imaging sensor(s), add/remove imaging sensor(s) and/or the like.

As shown at 118, which is an optional step, the simulator 210 may use a ranging model to generate sensory data, in particular sensory ranging data simulating sensory ranging data generated by one or range sensors mounted on the emulated vehicle. The range sensor(s), for example, a LIDAR sensor, a radar, an ultra-sonic sensor, a camera, an infrared camera and/or the like emulate the range sensor(s) mounted on the emulated vehicle moving in the simulated virtual realistic model. The emulated range sensor(s) may be mounted on the emulated vehicle according to one or more mounting attributes, for example, positioning on the emulated vehicle (e.g. location, orientation, elevations, etc.), FOV, range, overlap region with at least one adjacent range sensor and/or the like of the real range sensor(s) mounted on the real vehicle controlled by the autonomous driver 222. The simulator 210 may employ the ranging model to enhance the simulated virtual realistic model to simulate with simulated realistic ranging data that may be injected to the autonomous driving system 220 and/or the autonomous driver 222. The simulated sensory ranging data may be injected to the training autonomous driving system 220 as a feed to one or more native inputs of the training autonomous driving system typically connected to one or more of the range sensors. Additionally and/or alternatively, the simulated sensory ranging data may be injected to the training autonomous driver 222 as a feed to one or more software interfaces typically used by the autonomous driver 222 to collect the sensory ranging data.

Since the geographic map data as well as the visual imagery data are available for the geographical area, the ranging model created for the geographical area may be highly accurate. However, such accuracy may fail to represent real world sensory ranging data produced by real range sensor(s). The ranging model may therefore apply one or more noise pattern(s) to the simulated sensory ranging data to realistically simulate real world conditions.

Figure 4:
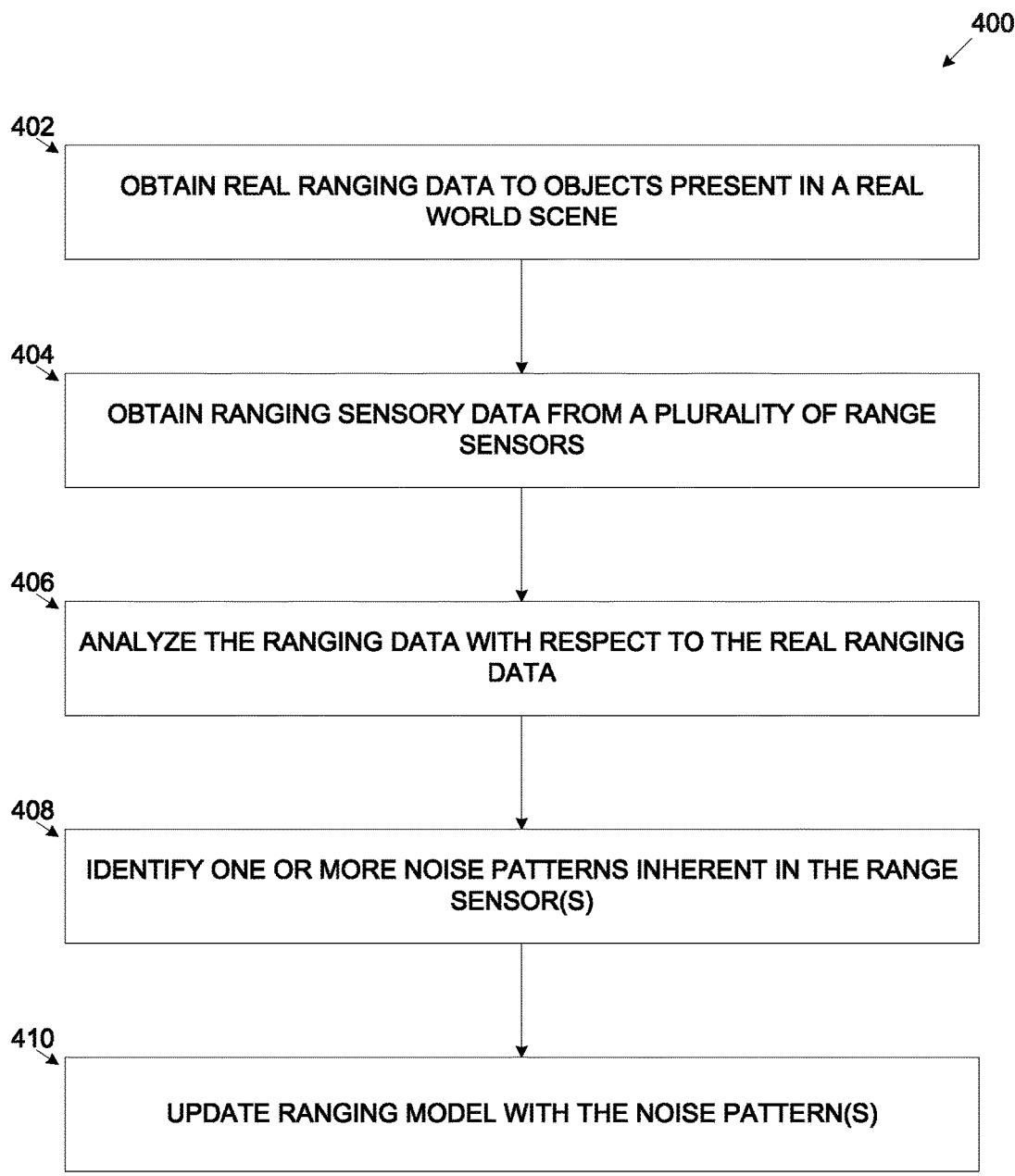
FIG. 4 is a flowchart of an exemplary process of creating a ranging sensory model of a geographical area, according to some embodiments of the present invention.

Reference is no made to FIG. 4, which is a flowchart of an exemplary process of creating a ranging sensory model of a geographical area, according to some embodiments of the present invention. An exemplary process 400 may be executed by a ranging model creator such as the ranging model creator 212 in a system such as the system 200 to create a ranging model for the simulated realistic model of a geographical area created by a simulator such as the simulator 210. While the process 400 may be applied in a plurality of real world scenes (geographical areas) for training a machine learning algorithm to accurately create a ranging model emulating real world geographical areas, for brevity, the process 400 is described for a single real world scene (geographical area).

As shown at 402, the process 400 starts with the ranging model creator 212 obtaining real ranging data for objects located in the real world scene (geographical area). The ranging model creator 212 may also analyze the geographic map data obtained for the real world scene to calculate the real ranging data. The ranging model creator 212 may also analyze the visual imagery data obtained for the real world scene using one or more image processing techniques and/or algorithms to calculate the real ranging data. Additionally, the ranging model creator 212 may collect the real ranging data from real world measurements made in the real world scene.

As shown at 404, the ranging model creator 212 obtains sensory ranging data from each of a plurality of range sensors depicting the real world scene. The range sensors which may include, for example, a LIDAR sensor, a radar, an ultra-sonic sensor, a camera, an infrared camera and/or the like may typically be mounted on a plurality of vehicles travelling in the real world scene, for example, a ground vehicle, an aerial vehicle and/or a naval vehicle.

Each of the ranging sensors is associated with positioning data indicating the positioning of each associated range sensor. The ranging model creator 212 may receive the positioning data from one or more positioning sensors typically installed, mounted and/or attached to the vehicle carrying the associated ranging sensor(s). The positioning sensors may include, for example, a GPS sensor, a gyroscope, an accelerometer, an IMU sensor, an elevation sensor and/or the like. The positioning of the respective range sensor(s) may be based on the GPS positioning data, on dead reckoning positioning calculated using the positioning data obtained from the gyroscope, the accelerometer, the IMU sensor and/or the like. Optionally, the positioning of the respective range sensor(s) may be based on a combination of the GPS positioning and the dead reckoning positioning which may provide improved positioning of the respective range sensor(s).

Using the positioning data, the ranging model creator 212 may accurately calculate the absolute location and/or position of each of the range sensors in the real world scene. This allows the ranging model creator 212 to calculate absolute ranging data for each of the range sensors by adjusting the sensory ranging data produced by the respective range sensor according to the absolute location and/or position of the respective range sensor.

Optionally, the positioning data includes motion data comprising one or more motion parameters of the associated range sensor(s). The motion parameter(s) may include, for example, a speed parameter, an acceleration parameter, a direction parameter, an orientation parameter, an elevation parameter and/or the like. Using the motion data, the ranging model creator 212 may improve accuracy of the absolute location and/or position of the associated range sensor(s) in the real world scene.

As shown at 406, the ranging model creator 212 analyzes the sensory ranging data obtained from the range sensors (after adjusted according to the positioning data) with respect to the real ranging data. The ranging model creator 212 may apply big-data analysis and/or analytics using one or more machine learning algorithms, for example, a neural network (e.g. DNN, GMM, etc.), an SVM and/or the like to analyze large amounts of sensory ranging data for a plurality of real world scenes.

Optionally, the ranging model creator 212 evaluates the sensory ranging data with relation to one or more mounting parameters of the range sensor(s), for example, a position, an orientation, an FOV and/or the like. Naturally, the mounting parameter(s) of a respective range sensor may have at least some effect on the sensory ranging data produced by the respective range sensor. Therefore, assuming the mounting parameter(s) are available to the ranging model creator 212, the ranging model creator 212 may identify optimal, preferred and/or recommended settings for one or more of the mounting parameters.

As shown at 408, using the machine learning algorithm(s), the ranging model creator 212 may analyze the sensory ranging data for a plurality of range sensors for a plurality of real world scenes to identify one or more noise patterns exhibited by one or more of the range sensors.

The noise pattern(s) may describe one or more noise characteristics, for example, noise, distortion, latency, calibration offset and/or the like which may be typical, inherent and/or characteristic of one or more of the range sensors.

The noise may result from other objects affecting which affect the object(s) to which the sensory ranging data refers, for example, partially obscuring the reference object(s) and/or the like. The noise may further describe one or more object attributes, for example, an external surface texture, an external surface composition, an external surface material and/or the like of the reference object(s) and/or of the other objects affecting the reference object(s). For example, some surface textures, surface compositions and/or surface materials may reflect differently rays projected by one or more of the range sensors and may therefore affect the accuracy of the acquired sensory ranging data. The ranging model creator 212 may therefore set the noise pattern(s) to map the sensory ranging data accuracy and/or performance with the attributes of the reference object(s) and/or of the other objects affecting the reference object(s) detected in the real world scene. The ranging model creator 212 may extract the object attribute(s) of the reference object(s) and/or of the other objects from the visual imagery data obtained for the real world scene. For example, the ranging model creator 212 may detect a tree in the visual imagery data and may associate the tree with predefined sensory ranging data accuracy and/or range sensor performance which is predefined and/or learned over time by the ranging model creator 212. The ranging model creator 212 may further obtain the object attribute(s) of the reference object(s) and/or of the other objects from one or more records, for example, a metadata record and/or the like associated with one of more of the objects located in the real world scene. Since the object(s) attributes may vary between different geographical locations, areas and./or real world scenes, retrieving object(s) attribute(s) from the metadata record may allow associating the object(s) with typical attributes as found in the respective real world scene. For example, a detailed map of the real world scene may include designations of structures located in the real world scene and may further include a metadata record associated with one or roe of the objects which describes the object attribute(s).

The distortion may result from one or more inherent limitations of the range sensor(s) which may present inaccuracies in the measured range to the reference object(s). The latency may refer to the latency from the time the range sensor(s) captured the sensory ranging data until the time the sensory ranging data is recorded and/or logged by a logging system. This latency may result for one or more reasons, for example, processing time of the range sensor to process the ranging sensory data, communication time for the range sensor to communicate the sensory ranging data to the logging system and/or the like. The calibration offset may result from one or more inherent limitations of the range sensor(s) wherein the range sensor(s) may not be ideally calibrated even following a calibration sequence. The calibration offset may further be inflicted by inaccurate mounting calibration of the range sensor(s) with respect to the vehicle such that the position, orientation, FOV and/or the like of the range sensor(s) may deviate from the intended position, orientation, FOV. Each noise pattern may therefore present values for one or more of the noise characteristics, for example, a noise value, a distortion value, a latency value, a calibration offset value and/or the like.

As shown at 410, the ranging model creator 212 may update a ranging model with the noise pattern(s) to establish a realistic simulation arena for the virtual realistic model replicating the real world scene (geographical area). The ranging model may be used to generate realistic simulation ranging data that may be injected to the autonomous driver 222 during training.

Optionally, the ranging model creator 212 may analyze the sensory ranging data with respect to the real ranging data while evaluating one or more environmental characteristics detected during acquisition of the sensory ranging data and/or part thereof and which may affect the sensory ranging data acquisition. The environmental characteristics may include, for example, a weather condition attribute, a timing attribute and/or the like. The weather condition attribute may include, for example, a humidity value, a temperature value, a precipitation value (e.g. rain, snow, etc.), a fog condition value and/or the like. The weather condition attribute(s) may affect the sensory ranging data acquisition, for example, foggy conditions may affect performance of one or more of the range sensors for instance, the LIDAR sensor, the radar, the camera, the infrared camera and/or the like. In another example, the temperature of the environment may affect the performance of one or more of the range sensors. The timing conditions may include for example, time of day, date and/or the like which may also affect performance of one or more of the range sensors. For example, the performance of one or more of the range sensors may be affected by light conditions, for example, day light, twilight, evening and/or night.

Reference is made once again to FIG. 1.

Using the ranging model, in addition to generating the simulated sensory ranging data for the static objects identified in the geographical area, the simulator 210 may further generate the simulated sensory ranging data for one or more of the dynamic objects inserted to the virtual realistic model replicating the geographical area. For example, assuming a tree is inserted into the virtual realistic model, the simulator 210 may use the ranging model to create simulated sensory ranging data adapted to the tree according to one or more of the noise pattern(s) identified by the ranging model creator 212 and applied in the ranging model. The simulator 210 may further adapted the simulated sensory ranging data for one or more of the static objects according to the noise, for example, the tree inserted into the virtual realistic model.

Optionally, the simulator 210 may analyze the generated simulation sensory ranging data produced by the emulated range sensor(s) mounted on the emulated vehicle to evaluate performance of the emulated range sensor(s) with respect to one or more of their mounting attributes. The simulator 210 may evaluate the accuracy of the simulated sensory ranging data that is produced by the emulated range sensor(s) and which may be affected by the mounting attribute(s). The simulator 210 may generate and evaluate alternate simulation sensory ranging data as produced by the range sensor having alternate mounting attribute(s), for example, a different orientation, a different position, a different FOV and/or the like. The simulator 210 may determine optimal settings for the mounting attribute(s) and may recommend the autonomous driving system 220 and/or the autonomous driver 222 to apply the optimal settings. Based on the offered settings, the designer(s) of the autonomous driving system 220 may take one or more actions, for example, adjust one or more of the ranging sensor(s) mounting attribute(s), use different range sensor(s), add/remove range sensor(s) and/or the like.

As shown at 120, the simulator 210 may generate additional simulation data for the virtual realistic model replicating the geographical area, for example, motion data, transport data and/or the like.

The simulated motion data may include one or more motion parameters of the emulated vehicle. The motion parameter(s) may include, for example, a speed parameter, an acceleration parameter, a direction parameter, an orientation parameter, an elevation parameter and/or the like. For example, assuming the emulated vehicle is a ground vehicle, the motion parameters may include a steering wheel angle parameter which may be indicative of the direction of the emulated ground vehicle. The simulated motion data may be injected to the training autonomous driving system 220 through a native input typically used by the autonomous driving system 220 to connect to one or more of the motion sensors and/or positioning sensors. Additionally and/or alternatively, the simulated sensory motion data may be injected to the training autonomous driver 222 as a feed to one or more software interfaces typically used by the autonomous driver 222 to collect the sensory motion data. The simulated motion data may complement the other simulated data of the virtual realistic model to improve replication of a real ride, drive, flight in the geographical area as experienced by the training autonomous driving system 220 and/or the autonomous driver 222.

The simulated transport data may include, for example, information simulating communication of the emulated vehicle with one or more other entities, for example, a vehicle, a control center, a road infrastructure object and/or the like. The communication may simulate for example, V2X communication between the emulated vehicle and the other entities. The simulated transport data may be injected to the training autonomous driving system 220 as a feed to one or more native inputs, ports and/or links typically used by the autonomous driving system 220 to connect to V2X communication channel(s). Additionally and/or alternatively, the simulated transport data may be injected to the training autonomous driver 222 as a feed to one or more software interfaces typically used by the autonomous driver 222 to collect the transport data. The simulated transport data may further complement the simulation of the virtual realistic model to improve replication of a real ride, drive, flight in the geographical area as experienced by the training autonomous driving system.

It is expected that during the life of a patent maturing from this application many relevant devices, systems, methods and computer programs will be developed and the scope of the terms imaging sensor, range sensor, machine learning algorithm and neural network are intended to include all such new technologies a priori.

As used herein the term "about" refers to ±10%.

The terms "comprises", "comprising", "includes", "including", "having" and their conjugates mean "including but not limited to". This term encompasses the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

The word "exemplary" is used herein to mean "serving as an example, an instance or an illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A computer implemented method of creating a simulated realistic virtual model of a geographical area for training an autonomous driving system, comprising:
    obtaining geographic map data of a geographical area;
    obtaining visual imagery data of the geographical area;
    classifying a plurality of static objects identified in the visual imagery data to corresponding labels to designate a plurality of labeled objects;
    superimposing the plurality of labeled objects over the geographic map data;
    generating a virtual three dimensional (3D) realistic model emulating the geographical area by synthesizing a corresponding visual texture for each of the plurality of labeled objects; and
    injecting synthetic 3D imaging feed of the realistic model to an input of at least one imaging sensor of the autonomous driving system controlling movement of an emulated vehicle in the realistic model, the synthetic 3D imaging feed is generated to depict the realistic model from a point of view of at least one emulated imaging sensor mounted on the emulated vehicle.

2. The computer implemented method of claim 1, wherein the synthesizing is done using at least one of the following implementations:
    applying at least one conditional generative adversarial neural network (cGAN) to transform a label of at least one of the plurality of labeled objects to a respective visual texture,
    extracting the visual texture of at least one of the plurality of labeled objects from the visual imagery data, and
    retrieving the visual texture of at least one of the plurality of labeled objects from a repository comprising a plurality of texture images of a plurality of static objects.

3. The computer implemented method of claim 1, wherein the synthetic 3D imaging feed is injected to a physical input of the autonomous driving system adapted to receive the input of the at least one imaging sensor.

4. The computer implemented method of claim 1, wherein the autonomous driving system is implemented as a computer software program, the synthetic 3D imaging feed is injected using at least one virtual driver emulating a feed of the at least one imaging sensor.

5. The computer implemented method of claim 1, further comprising adjusting at least one mounting attribute of the at least one imaging sensor according to analysis of a visibility performance of the at least one emulated imaging sensor emulating the at least one imaging sensor, the at least one mounting attribute is a member of a group consisting of: a positioning on the emulated vehicle, a Field Of View (FOV), a resolution and an overlap region with at least one adjacent imaging sensor.

6. The computer implemented method of claim 1, further comprising simulating a sensory ranging data feed generated by at least one emulated range sensor mounted on the emulated vehicle, the sensory ranging data feed is simulated using a simulated ranging model applying at least one noise pattern associated with at least one range sensor emulated by the at least one emulated range sensor.

7. The computer implemented method of claim 6, further comprising the at least one noise pattern is adjusted according to at least one object attribute of at least one of a plurality of objects emulated in the realistic model.

8. The computer implemented method of claim 6, further comprising adjusting at least one mounting attribute of the at least one range sensor according to analysis of a range accuracy performance of the at least one range sensor, the at least one mounting attribute is a member of a group consisting of: a positioning on the emulated vehicle, an FOV, a range and an overlap region with at least one adjacent range sensor.

9. The computer implemented method of claim 1, further comprising inserting at least one simulated dynamic object into the realistic model, the at least one simulated dynamic object is a member of a group consisting of: a ground vehicle, an aerial vehicle, a naval vehicle, a pedestrian, an animal, vegetation and a dynamically changing road infrastructure object.

10. The computer implemented method of claim 9, further comprising applying at least one of a plurality of driver behavior classes for controlling a movement of at least one simulated ground vehicle such as the ground vehicle, the at least one driver behavior class is adapted to the geographical area according to an analysis of typical driver behavior patterns identified in the geographical area, the at least one driver behavior class is selected according to a density function calculated for the geographical area according to recurrence of drivers prototype corresponding to the at least one driver behavior classes in the geographical area.

11. The computer implemented method of claim 1, further comprising injecting to the autonomous driving system simulated motion data emulated by at least one emulated motion sensor associated with the emulated vehicle, the simulated motion data comprising at least one motion parameter, the at least one motion parameter is a member of a group consisting of: a speed parameter, an acceleration parameter, a direction parameter, an orientation parameter and an elevation parameter.

12. The computer implemented method of claim 1, further comprising injecting to the autonomous driving system simulated transport data comprising Vehicle to Anything (V2X) communication between the emulated vehicle and at least one other entity.

13. The computer implemented method of claim 1, further comprising adjusting the synthetic 3D imaging feed according to at least one environmental characteristic which is a member of a group consisting of: a lighting condition, a weather condition attribute and a timing attribute.

14. The computer implemented method of claim 1, wherein the geographic map data includes at least one member of a group consisting of: a two dimensional (2D) map, a 3D map, an orthophoto map, an elevation map and a detailed map comprising object description for objects present in the geographical area.

15. The computer implemented method of claim 1, wherein the visual imagery data comprises at least one image which is a member of a group consisting of: a ground level image, an aerial image and a satellite image, wherein the at least one image is a 2D image or a 3D image.

16. The computer implemented method of claim 1, wherein each of the plurality of static objects is a member of a group consisting of: a road, a road infrastructure object, an intersection, a building, a monument, a structure, a natural object and a terrain surface.

17. The computer implemented method of claim 1, wherein the at least one imaging sensor is a member of a group consisting of: a camera, a video camera, an infrared camera and a night vision sensor.

18. A system for creating a simulated virtual realistic model of a geographical area for training an autonomous driving system, comprising:
at least one processor adapted to execute code, the code comprising:
code instructions to obtain geographic map data of a geographical area;
code instructions to obtain visual imagery data of the geographical area;
code instructions to classify a plurality of static objects identified in the visual imagery data to corresponding labels to designate a plurality of labeled objects;
code instructions to superimpose the plurality of labeled objects over the geographic map data;
code instructions to generate a virtual three dimensional (3D) realistic model emulating the geographical area by synthesizing a corresponding visual texture for each of the plurality of labeled objects; and
code instructions to inject synthetic 3D imaging feed of the realistic model to an input of at least one imaging sensor of the autonomous driving system controlling movement of an emulated vehicle in the realistic model, the synthetic 3D imaging feed is generated to depict the realistic model from a point of view of at least one emulated imaging sensor mounted on the emulated vehicle.

* * * * *

EX PARTE REEXAMINATION CERTIFICATE (12049th)
United States Patent
Atsmon

(10) Number: US 10,489,972 C1
(45) Certificate Issued: May 6, 2022

(54) REALISTIC 3D VIRTUAL WORLD CREATION AND SIMULATION FOR TRAINING AUTOMATED DRIVING SYSTEMS

(71) Applicant: Cognata Ltd., Rehovot (IL)

(72) Inventor: Dan Atsmon, Rehovot (IL)

Reexamination Request:
No. 90/014,797, Jul. 13, 2021

Reexamination Certificate for:
Patent No.: 10,489,972
Issued: Nov. 26, 2019
Appl. No.: 16/313,058
PCT Filed: May 29, 2017
PCT No.: PCT/IL2017/050598
§ 371 (c)(1),
(2) Date: Dec. 24, 2018
PCT Pub. No.: WO2018/002910
PCT Pub. Date: Jan. 4, 2018

Related U.S. Application Data

(60) Provisional application No. 62/384,733, filed on Sep. 8, 2016, provisional application No. 62/355,368, filed on Jun. 28, 2016.

(51) Int. Cl.
| | |
|---|---|
| *G06T 7/00* | (2017.01) |
| *G06F 30/20* | (2020.01) |
| *G06T 17/05* | (2011.01) |
| *G05D 1/02* | (2020.01) |
| *G05D 1/00* | (2006.01) |
| *G01C 21/32* | (2006.01) |
| *G01C 11/04* | (2006.01) |
| *G06T 19/00* | (2011.01) |
| *G06T 17/00* | (2006.01) |

(52) U.S. Cl.
CPC ............. *G01C 21/32* (2013.01); *G01C 11/04* (2013.01); *G05D 1/0088* (2013.01); *G05D 1/0221* (2013.01); *G06F 30/20* (2020.01); *G06T 17/05* (2013.01); *G06T 19/006* (2013.01); *G05D 2201/0213* (2013.01)

(58) Field of Classification Search
None
See application file for complete search history.

(56) References Cited

To view the complete listing of prior art documents cited during the proceeding for Reexamination Control Number 90/014,797, please refer to the USPTO's public Patent Application Information Retrieval (PAIR) system under the Display References tab.

*Primary Examiner* — William H. Wood

(57) ABSTRACT

A computer implemented method of creating a simulated realistic virtual model of a geographical area for training an autonomous driving system, comprising obtaining geographic map data of a geographical area, obtaining visual imagery data of the geographical area, classifying static objects identified in the visual imagery data to corresponding labels to designate labeled objects, superimposing the labeled objects over the geographic map data, generating a virtual 3D realistic model emulating the geographical area by synthesizing a corresponding visual texture for each of the labeled objects and injecting synthetic 3D imaging feed of the realistic model to imaging sensor(s) input(s) of the autonomous driving system controlling movement of an emulated vehicle in the realistic model where the synthetic 3D imaging feed is generated to depict the realistic model from a point of view of emulated imaging sensor(s) mounted on the emulated vehicle.

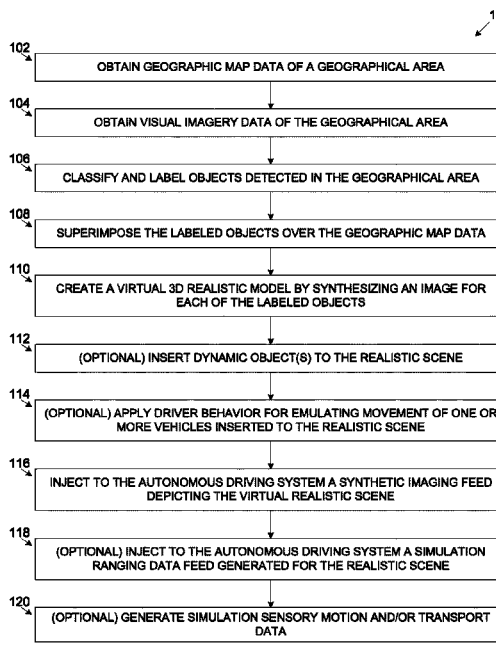

EX PARTE REEXAMINATION CERTIFICATE

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 18 are determined to be patentable as amended.

Claims 2-4, 6-7, and 9-17, dependent on an amended claim, are determined to be patentable.

Claims 5 and 8 were not reexamined.

1. A computer implemented method of creating a simulated realistic virtual model of a geographical area for training an autonomous driving system (*ADS*), comprising:
   obtaining geographic map data of a geographical area;
   obtaining visual imagery data of the geographical area;
   classifying a plurality of static objects identified in the visual imagery data to corresponding labels to designate a plurality of labeled objects;
   superimposing the plurality of labeled objects over the geographic map data;
   generating a virtual three dimensional (3D) realistic *ADS training* model emulating the geographical area by synthesizing a corresponding visual texture for each of the plurality of labeled objects; and
   injecting synthetic 3D imaging feed of the realistic model to an input of at least one imaging sensor of the autonomous driving system controlling movement of an emulated vehicle in the realistic model, the synthetic 3D imaging feed is generated to depict the realistic model from a point of view of at least one emulated imaging sensor mounted on the emulated vehicle.

18. A system for creating a simulated virtual realistic model of a geographical area for training an autonomous driving system (*ADS*), comprising:
    at least one processor adapted to execute code, the code comprising:
      code instructions to obtain geographic map data of a geographical area;
      code instructions to obtain visual imagery data of the geographical area;
      code instructions to classify a plurality of static objects identified in the visual imagery data to corresponding labels to designate a plurality of labeled objects;
      code instructions to superimpose the plurality of labeled objects over the geographic map data;
      code instructions to generate a virtual three dimensional (3D) realistic *ADS training* model emulating the geographical area by synthesizing a corresponding visual texture for each of the plurality of labeled objects; and
      code instructions to inject synthetic 3D imaging feed of the realistic model to an input of at least one imaging sensor of the autonomous driving system controlling movement of an emulated vehicle in the realistic model, the synthetic 3D imaging feed is generated to depict the realistic model from a point of view of at least one emulated imaging sensor mounted on the emulated vehicle.

\* \* \* \* \*